US010962847B2

United States Patent
Kim et al.

(10) Patent No.: US 10,962,847 B2
(45) Date of Patent: Mar. 30, 2021

(54) DISPLAY DEVICE HAVING AN INCLINED SIDE SURFACE

(71) Applicant: SAMSUNG DISPLAY CO., LTD., Yongin-si (KR)

(72) Inventors: So-Woon Kim, Suwon-si (KR); Donghun Lee, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/141,243

(22) Filed: Sep. 25, 2018

(65) Prior Publication Data

US 2019/0155085 A1    May 23, 2019

(30) Foreign Application Priority Data

Nov. 17, 2017  (KR) .................. 10-2017-0154264

(51) Int. Cl.
| | |
|---|---|
| *G02F 1/1345* | (2006.01) |
| *G02F 1/1339* | (2006.01) |
| *H05K 3/32* | (2006.01) |
| *G02F 1/1333* | (2006.01) |

(52) U.S. Cl.
CPC ........ *G02F 1/13452* (2013.01); *G02F 1/1339* (2013.01); *G02F 1/13458* (2013.01); *H05K 3/323* (2013.01); *G02F 2001/133357* (2013.01); *G02F 2001/133388* (2013.01)

(58) Field of Classification Search
None
See application file for complete search history.

(56) References Cited

U.S. PATENT DOCUMENTS

| | | | |
|---|---|---|---|
| 8,134,655 B2 | 3/2012 | Yang et al. | |
| 9,142,796 B2 | 9/2015 | Shin et al. | |
| 2016/0365027 A1* | 12/2016 | Suh ........................ | G06F 3/0412 |
| 2016/0377905 A1* | 12/2016 | Choi ................... | G02F 1/13452 |
| | | | 257/72 |
| 2017/0017108 A1* | 1/2017 | Shin ................... | G02F 1/133308 |
| 2017/0215290 A1 | 7/2017 | Bathiche et al. | |

FOREIGN PATENT DOCUMENTS

| | | |
|---|---|---|
| KR | 10-1328783 | 11/2013 |
| KR | 10-1611924 | 4/2016 |
| KR | 10-2017-0080282 | 7/2017 |

\* cited by examiner

*Primary Examiner* — David D Davis
(74) *Attorney, Agent, or Firm* — F. Chau & Associates, LLC

(57) ABSTRACT

A display device may include first and second base substrates, a pixel, a signal line, a pad electrode, and an electronic circuit connected to the pad electrode. The first base substrate includes a first planar surface and a first side surface, which is connected to the first planar surface and extends in a first direction. The second base substrate includes a second planar surface, which is disposed to face the first planar surface in a second direction crossing the first direction, and a second side surface, which is connected to the second planar surface and extends in the second direction. The pixel is disposed between the first and second base substrates. The signal line is disposed on the first base substrate and connected to the pixel. The pad electrode is disposed on the first side surface and connected to the signal line.

20 Claims, 21 Drawing Sheets

DISPLAY DEVICE HAVING AN INCLINED SIDE SURFACE

CROSS-REFERENCE TO RELATED APPLICATION

This U.S. non-provisional patent application claims priority under 35 U.S.C. § 119 to Korean Patent Application No. 10-2017-0154264, filed on Nov. 17, 2017 in the Korean Intellectual Property Office, the disclosure of which is incorporated by reference herein in its entirety.

TECHNICAL FIELD

Exemplary embodiments of the inventive concept relate to a display device, and in particular, to a display device which can be assembled with ease and reliability.

DISCUSSION OF RELATED ART

A module assembling system, which is a kind of back-end system for a process of fabricating a display panel, is used to electrically connect the display panel and a driver chip. In such a connection process, a method of mounting the driver chip may be classified into a chip-on-glass (COG) mounting method and a tape-automated-bonding (TAB) mounting method.

In the COG mounting method, a driver chip is directly mounted on a display panel and is used to transmit electrical signals to the display panel. In general, an anisotropic conductive film (ACF) is used to bond the driver chip to the display panel.

In the TAB mounting method, a tape carrier package mounted with a driver chip is bonded to a display panel. In this method, an anisotropic conductive film is used to bond the display panel to an end region of a tape carrier package and to bond a printed circuit board to another end region of the tape carrier package.

SUMMARY

According to an exemplary embodiment of the inventive concept, a display device may include a first base substrate, a second base substrate, a pixel, a signal line, a pad electrode, and an electronic circuit connected to the pad electrode. The first base substrate may include a first planar surface and a first side surface, which is connected to the first planar surface and extends in a first direction when viewed in a sectional view. The second base substrate may include a second planar surface, which is disposed to face the first planar surface in a second direction crossing the first direction, and a second side surface, which is connected to the second planar surface and extends in a second direction The pixel may be disposed between the first base substrate and the second base substrate. The signal line may be disposed on the first base substrate and connected to the pixel. The pad electrode may be disposed on the first side surface and connected to the signal line.

In an exemplary embodiment of the inventive concept, the electronic circuit may include a chip mounted on the second side surface.

In an exemplary embodiment of the inventive concept, the electronic circuit may include a circuit film attached to the first side surface and a chip mounted on the circuit film.

In an exemplary embodiment of the inventive concept, the circuit film may be extended along the first side surface to face a rear surface of the first substrate, and the chip may be disposed on the rear surface of the first substrate.

In an exemplary embodiment of the inventive concept, an area of the first planar surface may be substantially equal to that of the second planar surface, and an area of the rear surface of the first substrate may be less than an area of the first planar surface.

In an exemplary embodiment of the inventive concept, the pad electrode may include a first portion, which is disposed on the second side surface and is connected to the electronic circuit, and a second portion, which is disposed on the first planar surface and is connected to the signal line. The first and second portions may constitute a single body of the pad electrode.

In an exemplary embodiment of the inventive concept, an angle between an extension direction of the first portion and an extension direction of the second portion may be an acute angle.

In an exemplary embodiment of the inventive concept, the display device may further include an insulating layer disposed on the signal line to provide an opening exposing a portion of the signal line. The first portion may be disposed to fill the opening.

In an exemplary embodiment of the inventive concept, the pad electrode may include a material different from the signal line.

In an exemplary embodiment of the inventive concept, the signal line may include a transparent conductive oxide material.

In an exemplary embodiment of the inventive concept, the pad electrode may include a metallic material.

In an exemplary embodiment of the inventive concept, the first side surface may include a plurality of inclined surfaces. When viewed in a sectional view, the plurality of inclined surfaces may include a first inclined surface extending in the second direction and a second inclined surface extending in a third direction crossing the second direction and the first direction.

The second inclined surface may be connected to the first inclined surface.

According to an exemplary embodiment of the inventive concept, a display device may include a first display panel, an electronic circuit, a second display panel, and a cover member. The first display panel may include a first base substrate. a second base substrate, a pixel, and a pad electrode. The first base substrate may include a first side surface, and the second base substrate may face the first base substrate and may include a second side surface. The pixel may he disposed between the first base substrate and the second base substrate. The pad electrode may be disposed on the first side surface and may be connected to the pixel. The electronic circuit may be connected to the pad electrode. The second display panel may be spaced apart from the first display panel in a specific direction, and may include a third base substrate and a fourth base substrate. The third base substrate mal include a third side surface facing the first side surface. The fourth base substrate may face the third base substrate and may include a fourth side surface facing the second side surface. The cover member may be disposed between the first display panel and the second display panel. The first side surface may be extended in a direction that is inclined relative to the second side surface, and the third side surface may be extended in a direction parallel to the fourth side surface.

In an exemplary embodiment of the inventive concept, the display device may further include a spacer disposed between the first base substrate and the second base substrate. A minimum distance between the spacer and the cover member may be less than that between the first side surface and the cover member, when measured in the specific direction.

In an exemplary embodiment of the inventive concept, the spacer may have an elastic property.

In an exemplary embodiment of the inventive concept, the electronic circuit may include a chip mounted on the first side surface.

In an exemplary embodiment of the inventive concept, the electronic circuit may include a circuit film disposed on the first side surface and connected to the pad electrode, and a chip mounted on the circuit film.

In an exemplary embodiment of the inventive concept, the first side surface may include a plurality of inclined surfaces, each of which is inclined at an angle relative to the second side surface.

In an exemplary embodiment of the inventive concept, the cover member may include a horizontal portion extending in the specific direction and covering a portion of the second base substrate and a portion of the fourth base substrate, and a vertical portion extending from the horizontal portion in a direction crossing the specific direction and being interposed between the first display panel and the second display panel. The vertical portion may be parallel to the second side surface.

In an exemplary embodiment of the inventive concept, the cover member may be disposed apart from the pad electrode.

According to an exemplary embodiment of the inventive concept, a method of fabricating a display device includes forming signal lines on a front surface of an initial first base substrate, and the signal lines are spaced apart from one another. The method further includes forming an insulating layer on the initial first base substrate to cover the signal lines. The method additionally includes removing a portion of the insulating layer to form a plurality of openings to expose a portion of each of the signal lines. The method also includes forming an initial second base substrate on the initial first base substrate with a pixel formed therebetween, and grinding a side surface of the initial first base substrate to form an inclined surface that is inclined at an acute angle relative to the front surface of the initial first base substrate. In addition, the method includes forming pad electrodes inside the plurality of openings, and the pad electrodes contact a portion of each of the signal lines and a portion of the inclined surface of the initial first base substrate.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1A:
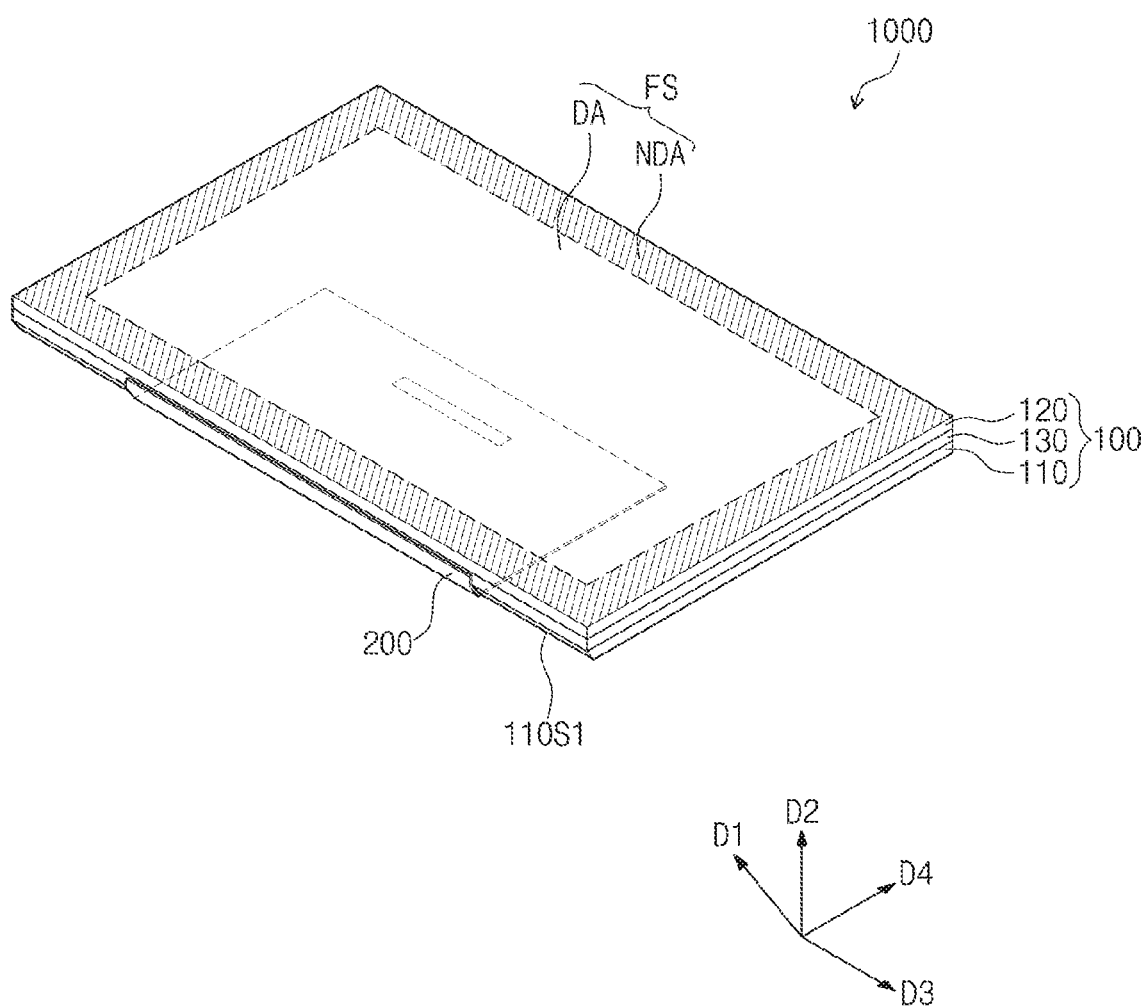
FIGS. 1A and 1B are perspective views illustrating a display device according to an exemplary embodiment of the inventive concept.

Exemplary embodiments of the inventive concept provide a display device with a reduced bezel region.

Exemplary embodiments of the inventive concept also provide a display device that can be assembled with ease and reliability.

Exemplary embodiments of the inventive concept will now be described more fully hereinafter with reference to the accompanying drawings. In the drawings, the thicknesses of layers and regions may be exaggerated for clarity. Like reference numerals in the may refer to like elements throughout this application.

Figure 1B:
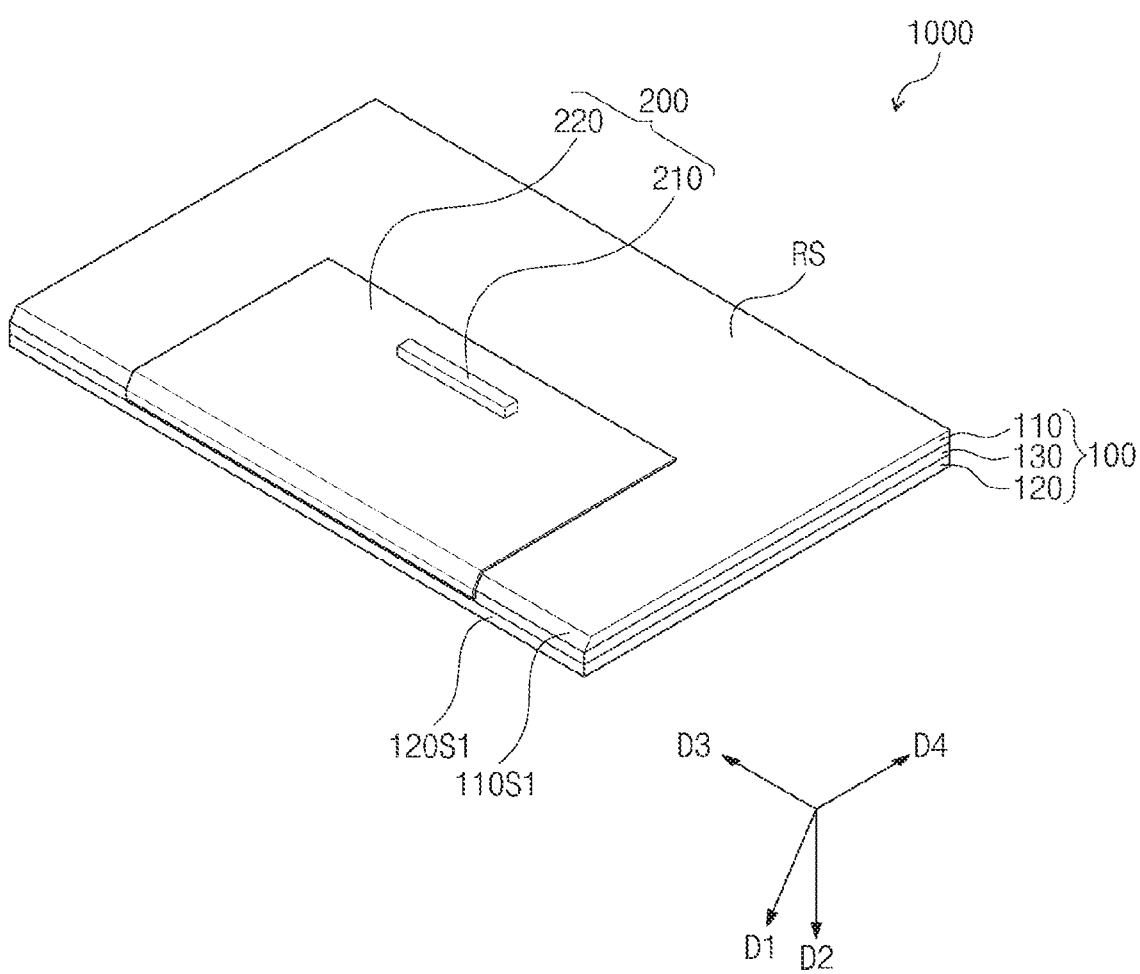
Figure 2A:
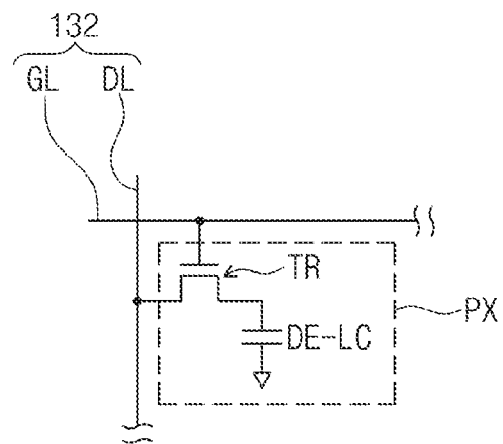
FIGS. 2A and 2B are circuit diagrams illustrating some components provided in the display device shown in FIG. 1A according to an exemplary embodiment of the inventive concept.
Figure 2B:
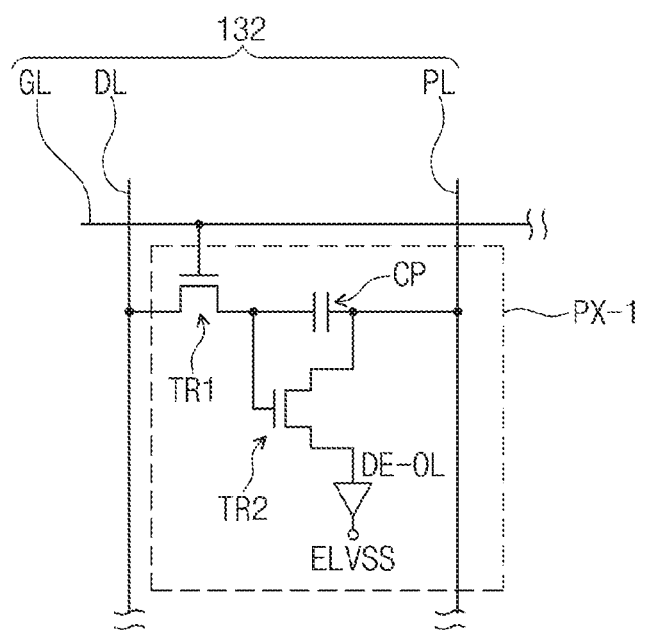

FIGS. 1A and 1B are perspective views illustrating a display device according to an exemplary embodiment of the inventive concept. FIGS. 2A and 2B are circuit diagrams illustrating some components provided in the display device shown in FIG. 1A according to an exemplary embodiment of the inventive concept. Hereinafter, a display device according to an exemplary embodiment of the inventive concept will be described with reference to FIGS. 1A to 2B. For convenience of description, an inverted shape of a display device 1000 of FIG. 1A is illustrated in FIG. 1B.

The display device 1000 may include a display panel 100 and an electronic circuit 200, as shown in FIGS. 1A and 1B. The display panel 100 may be configured to display an image on a front surface FS.

The front surface FS may include a display region DA and a peripheral region NDA. The display region DA may be used to display an image. The display device 1000 may be configured to display an image on the front surface FS, based on electrical signals applied thereto.

The peripheral region NDA may be provided near or around the display region DA. An area and a shape of the display region DA may be defined by the peripheral region NDA. However, the inventive concept is not limited thereto, and in exemplary embodiments of the inventive concept, the display device 1000 may be configured without the peripheral region NDA.

The display panel 100 may include a first base substrate 110, a second base substrate 120, and a pixel layer 130. The first base substrate 110 may define a rear surface RS of the display panel 100. The first base substrate 110 may include an inclined surface 110S1 that is substantially parallel to a first direction D1. The rear surface RS may be substantially perpendicular to a second direction D2. For example, the rear surface RS may be substantially parallel to both of a third direction D3 and a fourth direction D4. The inclined surface 110S1 may be provided on a surface that is connected to the rear surface RS and is one of the side surfaces of the first base substrate 110. The inclined surface 110S1 of the first base substrate 110 may extend in a direction crossing a side surface 120S1 of the second base substrate 120, which will be described further below.

The first base substrate 110 may be formed of or include an insulating material. The first base substrate 110 may include a rigid material. For example, the first base substrate 110 may be formed of or include glass. In an exemplary embodiment of the inventive concept, the first base substrate 110 may be formed of or include a material, allowing for easy formation of the inclined surface 110S1. However, the inventive concept is not limited thereto, and in exemplary embodiments of the inventive concept, the first base substrate 110 may be formed of or include an organic material (e.g., plastic materials).

The second base substrate 120 may be provided to face the first base substrate 110 in the second direction D2. The second base substrate 120 may define the front surface FS of the display panel 100. All of the side surfaces of the second base substrate 120 connected to the front surface FS may be substantially parallel to the second direction D2.

The pixel layer 130 may be provided between the first base substrate 110 and the second base substrate 120. The pixel layer 130 may include a plurality of signal lines and a plurality of pixels. The signal lines may be configured to electrically connect the pixels to the electronic circuit 200. Each of the pixels may be used to display light constituting an image. Some examples of the pixel are illustrated in FIGS. 2A and 2B.

As shown in FIG. 2A, a pixel PX may be connected to a gate line GL and a data line DL. The gate line GL may be used to provide a gate signal to the pixel PX. The pixel PX may be turned on or off by the gate signal. The data line DL may be used to provide a data signal to the pixel PX. The data signal may include an image signal. The pixel PX may be configured to display light based on the data signal.

The gate line GL and the data line DL may constitute the signal lines (e.g., a signal line 132). Thus, at least one of the gate line GL and the data line DL may be connected to the electronic circuit 200, and the gate signal and the data signal may be electrical signals that are transmitted from the electronic circuit 200.

The pixel PX may include a thin-film transistor TR and a liquid crystal capacitor DE-LC. The liquid crystal capacitor DE-LC may be a display element of the pixel PX.

If the thin-film transistor TR is turned on by the gate signal transmitted through the gate line GL, the data signal provided from the data line DL may be transmitted to the liquid crystal capacitor DE-LC through the thin-film transistor TR.

The liquid crystal capacitor DE-LC may include a pixel electrode, a common electrode, and a liquid crystal layer. A voltage corresponding to the data signal transmitted from the thin-film transistor TR may be used to change an alignment of liquid crystal molecules in the liquid crystal layer of the liquid crystal capacitor DE-LC, and such a change in alignment of the liquid crystal molecules may be used to realize various gradation levels.

In exemplary embodiments of the inventive concept, as shown in FIG. 2B, a pixel PX-1 may be connected to the gate line GL, the data line DL, and a power line PL. The gate line GL and the data line DL may be configured in the manner described with reference to FIG. 2A.

In an exemplary embodiment of the inventive concept, the signal line 132 may further include the power line PL. The power line PL may be used to supply a power voltage to the pixel PX-1. For example, the power line PL may be connected to the electronic circuit 200 and may be used to receive a power signal to be provided from the electronic circuit 200. However, the inventive concept is not limited thereto, and in exemplary embodiments of the inventive concept, the power line PL may be directly connected to an external power supply circuit, instead of the electronic circuit 200.

The pixel PX-1 may include a first thin-film transistor TR1, a second thin-film transistor TR2, a capacitor CP, and an organic light emitting device DE-OL. The organic light emitting device DE-OL may be used as a display device of the pixel PX-1.

If the first thin-film transistor TR1 is turned on by the gate signal transmitted through the gate line GL, the data signal provided from the data line DL may be transmitted to the capacitor CP through the first thin-film transistor TR1. The capacitor CP may be connected to the first thin-film transistor TR1 and the power line PL. The capacitor CP may be charged to a voltage corresponding to a potential difference between the data signal and the power signal, which are respectively provided through the first thin-film transistor TR1 and the power line PL.

The second thin-film transistor TR2 may be turned on or off by a voltage charged in the capacitor CP. If the voltage charged in the capacitor CP is higher than a predetermined value, the second thin-film transistor TR2 may be turned on to allow the power signal to be transmitted from the power line PL to the organic light emitting device DE-OL.

The organic light emitting device DE-OL may be configured to generate light corresponding to a potential difference between the power signal, which is provided from the power line PL, and a reference voltage ELVSS. Brightness of the light may be determined by the potential difference between the power signal and the reference voltage ELVSS.

If a display element can be controlled by an electrical signal to emit light, the display element may be used as a display element of the pixels PX and PX-1 according to an exemplary embodiment of the inventive concept, and the number and structure of signal lines connected to the display element can be variously changed depending on an operation method of the display element. For example, the pixel layer 130 may be configured to include electrophoresis devices or electrowetting devices, instead of the liquid crystal capacitor or the organic light emitting device. The kind of display elements in the pixels of the pixel layer 130 may be variously changed, and the inventive concept is not limited to specific kinds of display elements.

Referring back to FIGS. 1A and 1B, the electronic circuit 200 may be provided beside and electrically connected to the display panel 100. The electronic circuit 200 may provide electrical signals to the display panel 100. In exemplary embodiments of the inventive concept, the electronic circuit 200 may receive electrical signals from the display panel 100.

The electronic circuit 200 may include a driver chip 210 and a circuit film 220. The driver chip 210 may be mounted on the circuit film 220. The driver chip 210 may include a plurality of electronic devices. The driver chip 210 may be configured to generate electrical signals or to process received electrical signals and provided the processed electrical signals to the outside.

The circuit film 220 may include an insulating film and signal lines. The signal lines may be used to electrically connect the driver chip 210 to the display panel 100. The driver chip 210 may be mounted on the circuit film 220, as described above, and may be connected to the signal lines. However, the inventive concept is not limited thereto, and in exemplary embodiments of the inventive concept, the driver chip 210 may be directly mounted on the display panel 100.

The circuit film 220 may be bent along an edge of the display panel 100 and may include a portion that is extended to face the rear surface RS. The circuit film 220 may be extended to enclose the inclined surface 110S1 and to face at least a portion of the rear surface RS. Here, the electronic circuit 200 may be attached to the rear surface RS of the display panel 100 by a coupling member.

In an exemplary embodiment of the inventive concept, since the display device 1000 includes the display panel 100 with the inclined surface 110S1, it may be possible to prevent the peripheral region NDA from being affected by a region, to which the electronic circuit 200 is coupled. Accordingly, the peripheral region NDA may be designed, regardless of the coupling region of the electronic circuit 200, and thus, the display device may be provided to have a small bezel region.

Since the coupling of the electronic circuit 200 is realized through the inclined surface 110S1, it may be possible to prevent the electronic circuit 200 from being in contact with a part provided outside the display panel 100. Accordingly, it may be possible to realize a stable coupling between the electronic circuit 200 and the display panel 100. This will be described in more detail below.

Figure 3:
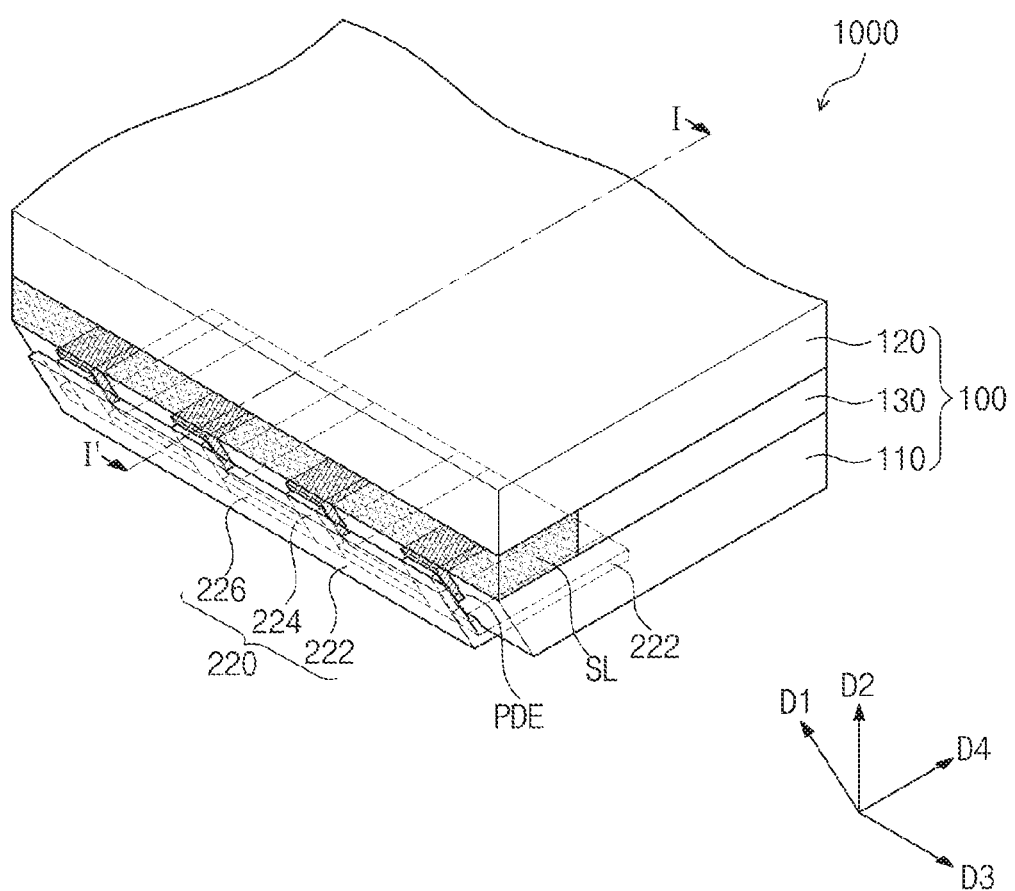
FIG. 3 is a portion perspective view illustrating a portion of a display device according to an exemplary embodiment of the inventive concept.
Figure 4A:
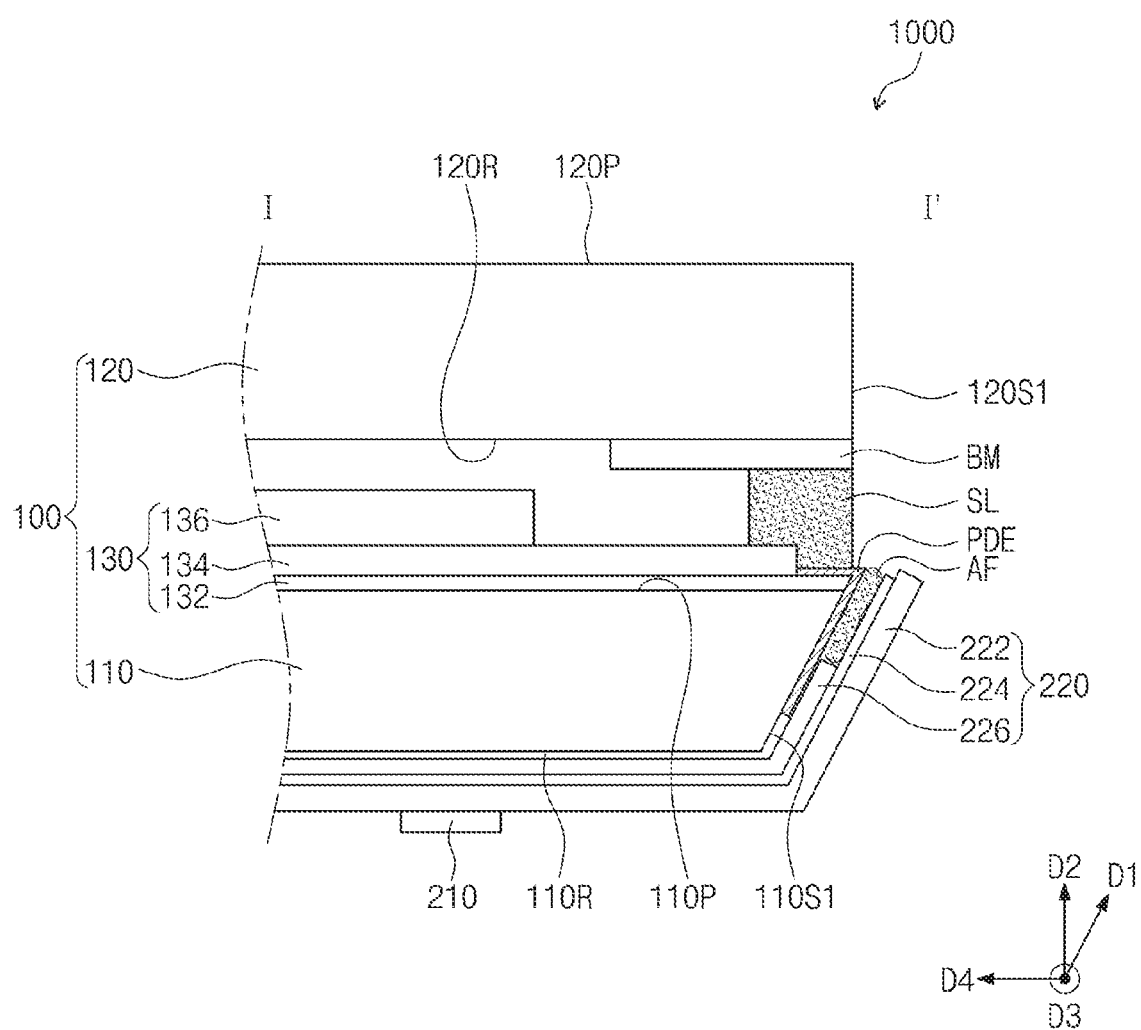
FIGS. 4A and 4B are sectional views taken along line I-I' of FIG. 3 according to exemplary embodiments of the inventive concept.
Figure 4B:
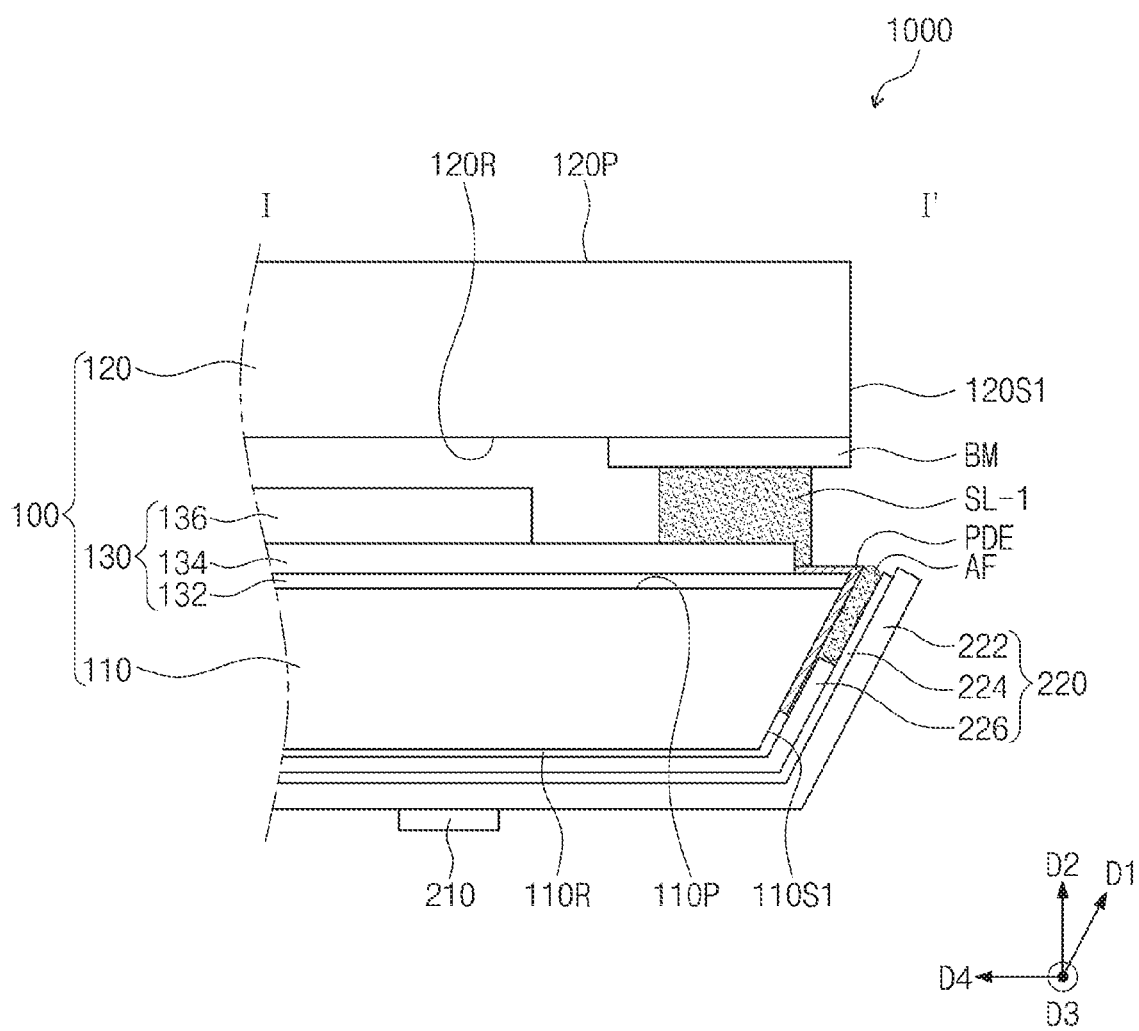

FIG. 3 is a portion perspective view illustrating a portion of a display device according to an exemplary embodiment of the inventive concept. FIGS. 4A and 4B are sectional views taken along line I-I' of FIG. 3 according to exemplary embodiments of the inventive concept. For convenience in illustration, a portion of the display device of FIG. 1A is illustrated in FIG. 3, and veiled elements are illustrated with dotted lines. Hereinafter, an exemplary embodiment of the inventive concept will be described with reference to FIGS. 3 to 4B. For concise description, an element previously described with reference to FIGS. 1A to 2B may be identified by the same reference number without repeating an overlapping description thereof.

As shown in FIGS. 3 to 4B, the pixel layer 130 may include the signal line 132, an insulating layer 134, and a pixel 136. The signal line 132 may be provided on the first base substrate 110. The signal line 132 may be extended to an edge region of the first base substrate 110, at which the inclined surface 110S1 is defined. The signal line 132 may be one of the gate line GL (e.g., see FIG. 2A), the data line DL (e.g., see FIG. 2A), the power line PL (e.g., see FIG. 2B), or a terminal for the reference voltage ELVSS, which have been described above.

The insulating layer 134 may be provided between the pixel 136 and the signal line 132. The insulating layer 134 may be provided to expose at least a portion of the signal line 132. For example, the insulating layer 134 may be provided to cover a portion of the signal line 132, and this may make it possible to electrically separate the signal line 132 from neighboring elements. Additionally, the insulating layer 134 may be provided to expose another portion of the signal line 132, and this may allow the signal line 132 to be easily coupled to another element.

For example, the insulating layer 134 may be provided to expose a portion of the signal line 132, near the edge region of the first base substrate 110. At least a portion of the signal line 132 exposed by the insulating layer 134 may be a pad.

The pixel 136 may correspond to one of the pixels PX and PX-1 shown in FIGS. 2A and 2B. For convenience of illustration, in FIG. 4, the pixel 136 and the insulating layer 134 are illustrated as distinct elements, but the insulating layer 134 may be a part of the pixel 136. For convenience of illustration, in FIG. 4, the pixel 136 and the signal line 132 are illustrated to be electrically disconnected from each other, but the pixel 136 may be electrically connected to the signal line 132 in another region. Accordingly, the pixel 136 may be electrically connected to the electronic circuit 200 through the signal line 132.

The display panel 100 may include a pad electrode PDE. The pad electrode PDE may be provided on one of the side surfaces of the first base substrate 110. Here, the side surface provided with the pad electrode PDE may be the inclined surface 110S1. The inclined surface 110S1 may be a line-shaped region that is linearly extended in the first direction D1. The pad electrode PDE may be extended along the inclined surface 110S1 and may be in contact with a side surface of the signal line 132.

The pad electrode PDE may be extended to cover a side region of a front surface 110P of the first base substrate 110 and the inclined surface 110S1 of the first base substrate 110. In other words, the pad electrode PDE may be overlapped with the front surface of the first base substrate 110 and the inclined surface 110S1 of the first base substrate 110. The top surface of the first base substrate 110 may be shaped like a line extending in the second direction D2.

The pad electrode PDE may be provided on the top surface of the first base substrate 110 to be in contact with the exposed portion of the signal line 132. Accordingly, the pad electrode PDE and the signal line 132 may have an increased contact area and a reduced contact resistance, and this may make it possible to realize stable electric characteristics of the display device. However, the inventive concept is not limited thereto, and in exemplary embodiments of the inventive concept, the pad electrode PDE may be locally provided on the inclined surface 110S1 and may not be overlapped with the front surface 110P of the first base substrate 110.

The pad electrode PDE may have a bending shape including lines extending in the first direction D1 and the second direction D2, when viewed in a sectional view. The bending portion of the pad electrode PDE may have an acute angle. The bending portion may have a shape corresponding to a shape of the edge region of the first base substrate 110. This will be described in more detail below.

As described above, the inclined surface 110S1 of the first base substrate 110 may extend in a direction crossing the side surface 120S1 of the second base substrate 120. An end of the front surface 110P of the first base substrate 110 may be aligned to an end of the second base substrate 120. However, an end of a rear surface 110R of the first base substrate 110 may not be aligned to the end of the second base substrate 120.

The display panel 100 may further include a seal member SL or SL-1 and a light blocking pattern BM. The seal member SL or SL-1 may be provided between the first base substrate 110 and the second base substrate 120 to physically connect the first base substrate 110 to the second base substrate 120. In the present exemplary embodiment, the portion of the signal line 132 exposed by the insulating layer 134 may be overlapped with the seal member SL or SL-1, when viewed in a plan view.

For example, as shown in FIG. 4A, the seal member SL may be provided to have a side surface aligned to the side surface 120S1 of the second base substrate 120. Accordingly, a portion of the pad electrode PDE overlapped with the front surface 110P of the first base substrate 110 may be covered with the seal member SL.

As shown in FIG. 4B, the seal member SL-1 may be provided to have a side surface, which is not aligned with the side surface 120S1 of the second base substrate 120. The seal member SL-1 may be placed at an inner region of the display device, compared with the side surface 120S1 of the second base substrate 120. In other words, the seal member SL-1 may be provided to expose at least a portion the portion of the pad electrode PDE overlapped with the front surface 110P of the first base substrate 110. The display device 1000 may include various seal members, and the inventive concept is not limited to a specific shape of the seal member.

Referring back to FIGS. 3 to 4B, the light blocking pattern BM may be provided on a rear surface 120R of the second base substrate 120. The second base substrate also includes a front surface 120P opposite the rear surface 120R. The light blocking pattern BM may be used to define the peripheral region NDA (e.g., see FIG. 1A). The light blocking pattern BM may be provided to be overlapped with the seal member SL, when viewed in a plan view. The light blocking pattern BM may be configured to block or absorb light to be incident into the light blocking pattern BM. Accordingly, a portion of the seal member SL or the signal line 132, which is overlapped with the light blocking pattern BM, may not be recognized through the front surface FS (e.g., see FIG. 1A). However, the inventive concept is not limited thereto, and in exemplary embodiments of the inventive concept, the light blocking pattern BM or the seal member SL may be omitted.

As described above, the electronic circuit 200 may include the driver chip 210 and the circuit film 220, on which the driver chip 210 is mounted. The circuit film 220 may include an insulating film 222, a circuit 224, and an insulating layer 226.

The insulating film 222 may be formed of or include an electrically insulating material. The insulating film 222 may have a flexible property. Accordingly, the insulating film 222 may be bent to correspond to various shapes of the edge region of the first base substrate 110 and thus may be stably placed on the rear surface of the display panel 100.

The circuit 224 may be mounted on the insulating film 222. The circuit 224 may be coupled to the driver chip 210. The circuit 224 may be provided on the insulating film 222 to cover the insulating layer 226. A portion of the circuit 224 may be exposed from the insulating layer 226 and may be coupled to the pad electrode PDE. The insulating layer 226 may prevent the circuit 224 from forming a short circuit with another element, in other regions except for the exposed region.

According to an exemplary embodiment of the inventive concept, the electronic circuit 200 may extend along the inclined surface 110S1 and may enclose a side region of the display panel 100. The circuit film 220 may be bent at an obtuse angle relative to the rear surface of the first base substrate 110. Since the electronic circuit 200 is bent at an angle larger than a right angle, it may be possible to relieve a bending stress exerted on the electronic circuit 200 and to increase reliability of the display device 1000.

In the present exemplary embodiment, the display device 1000 may further include a coupling member AF. The coupling member AF may be provided between the pad electrode PDE and the circuit 224 to physically and electrically couple the display panel 100 and the electronic circuit 200 to each other. The coupling member AF may include an anisotropic conductive film and a solder. In an exemplary embodiment of the inventive concept, since the display device 1000 further includes the coupling member AF, it may be possible to realize a stable coupling between the display panel 100 and the electronic circuit 200 and to more effectively increase the reliability of the display device 1000.

Figure 5A:
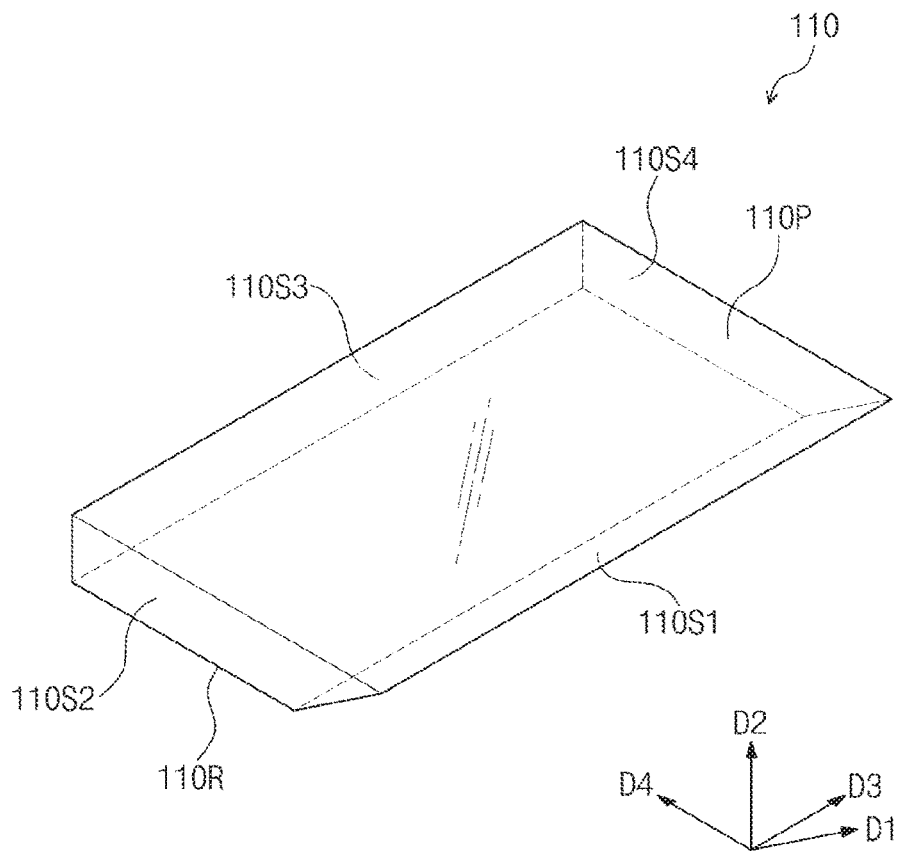
FIG. 5A is a perspective view illustrating a first base substrate according to an exemplary embodiment of the inventive concept.
Figure 5B:
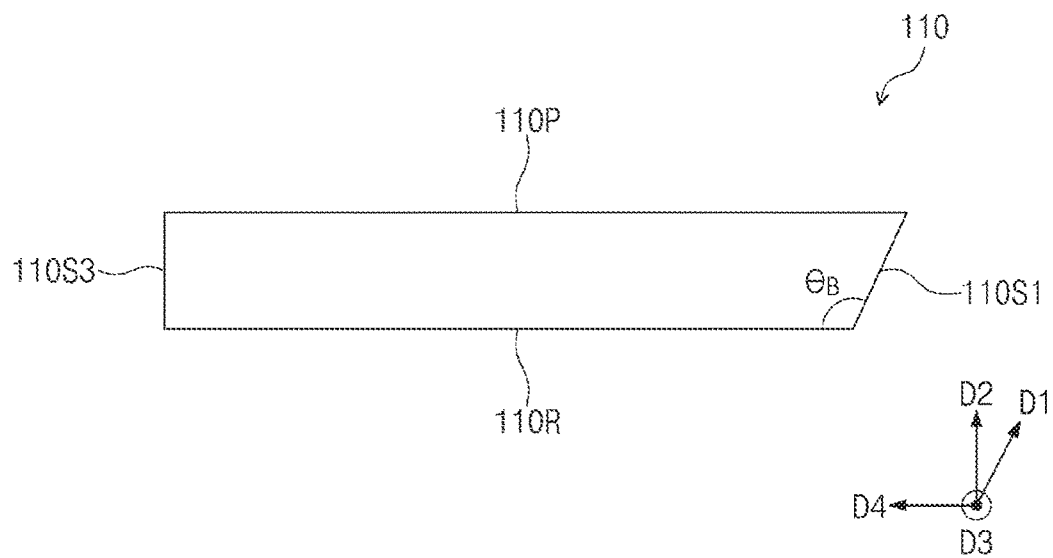
FIG. 5B is a sectional view illustrating the first base substrate of FIG. 5A according to an exemplary embodiment of the inventive concept.
Figure 5C:
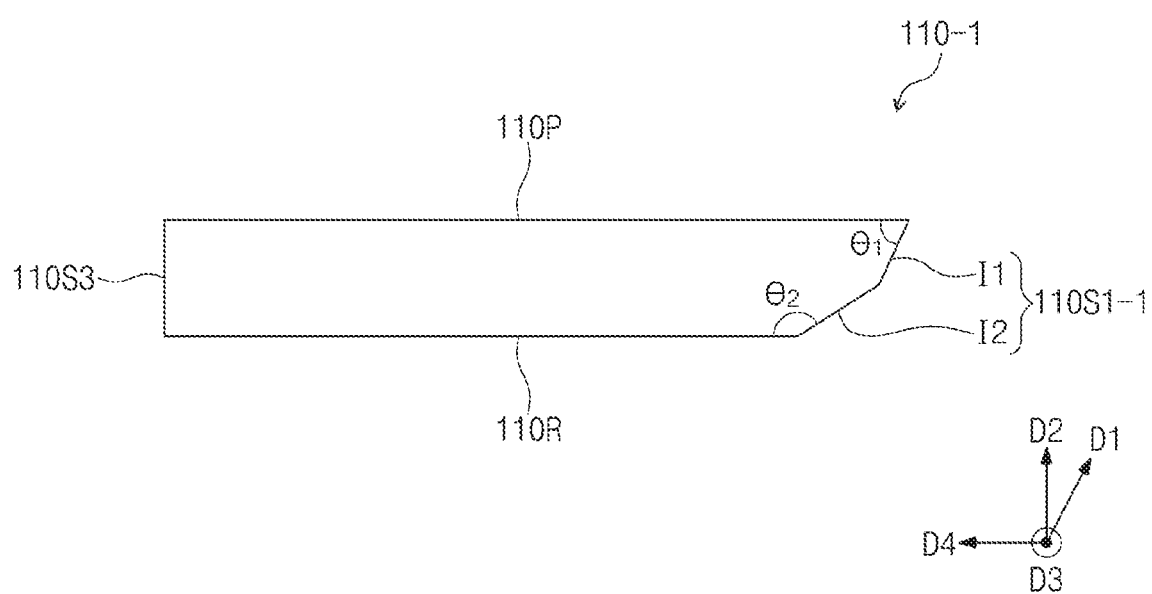
FIG. 5C is a sectional view illustrating a first base substrate according to an exemplary embodiment of the inventive concept.

FIG. 5A is a perspective view illustrating a first base substrate according to an exemplary embodiment of the inventive concept, and FIG. 5B is a sectional view illustrating the first base substrate of FIG. 5A according to an exemplary embodiment of the inventive concept. FIG. 5C is a sectional view illustrating a first base substrate according to an exemplary embodiment of the inventive concept. Some components are described to be projected in FIG. 5A, a perspective view of the first base substrate is illustrated in FIG. 5A, and in FIG. 5C and FIG. 5B, elements corresponding to each other are identified by the same reference number. Hereinafter, an exemplary embodiment of the inventive concept will be described with reference to FIGS. 5A to 5C.

As shown in FIGS. 5A and 5B, the first base substrate 110 may include the front surface 110P, the rear surface 110R, and a plurality of side surfaces 110S1 (e.g., of FIG. 1A), 110S2, 110S3, and 110S4. The front surface 110P may be a surface that is substantially perpendicular to the second direction D2 and is substantially parallel to a plane defined by the third direction D3 and the fourth direction D4. The front surface 110P may be a surface facing the rear surface 120R of the second base substrate 120 (e.g., see FIG. 1A). The pixel layer 130 (e.g., see FIG. 1A) may be provided on the front surface 110P.

The rear surface 110R may be a surface facing the front surface 110P in the second direction D2. The rear surface 110R may define the rear surface RS (e.g., see FIG. 1B) of the display panel 100 (e.g., see FIG. 1A).

In the present exemplary embodiment, the front surface 110P and the rear surface 110R may have areas different from each other. The rear surface 110R may have an area smaller than that of the front surface 110P. Accordingly, the front surface 110P may include a portion, which is overlapped with the rear surface 110R, and another portion, which is not overlapped with the rear surface 110R, when viewed in a plan view. The whole surface of the rear surface 110R may be overlapped with the front surface 110P. Accordingly, an area of the overlapping portion of the front surface 110P overlapped with the rear surface 110R may be substantially equal to an area of the rear surface 110R.

The side surfaces 110S1, 110S2, 110S3, and 110S4 may be provided between the front surface 110P and the rear surface 110R, and each of the side surfaces 110S1, 110S2, 110S3, and 110S4 may be connected to the front surface 110P and the rear surface 110R. Each of the side surfaces 110S1, 110S2, 110S3, and 110S4 may be provided to cross both of the third direction D3 and the fourth direction D4. The side surfaces 110S1, 110S2, 110S3, and 110S4 may be referred to as first to fourth side surfaces 110S1, 110S2, 110S3, and 110S4.

According to an exemplary embodiment of the inventive concept, the first base substrate 110 may include an inclined surface, which is provided on a side surface of one of the first to fourth side surfaces 110S1, 110S2, 110S3, and 110S4. In the present exemplary embodiment, the inclined surface may be defined on the first side surface 110S1. The first side surface 110S1 (hereinafter, an inclined surface) may be a surface that is parallel to a plane defined by the first direction D1 and the third direction D3. The inclined surface 110S1 may extend in a direction crossing all of the second to fourth side surfaces 110S2, 110S3, and 110S4.

The second side surface 110S2 may be connected to an end of the inclined surface 110S1. The second side surface 110S2 may be a surface that is parallel to a plane defined by the second direction D2 and the fourth direction D4.

The third side surface 110S3 may be a surface facing the inclined surface 110S1 in the fourth direction D4. The third side surface 110S3 may be parallel to a plane defined by the second direction D2 and the third direction D3. The third side surface 110S3 may extend in a direction crossing the inclined surface 110S1. For example, in the present exemplary embodiment, the third side surface 110S3 may not be parallel to the inclined surface 110S1.

The fourth side surface 110S4 may be connected to an opposite end of the inclined surface 110S1. The fourth side surface 110S4 may be a surface facing the second side surface 110S2. The fourth side surface 110S4 may be parallel to a plane defined by the second direction D2 and the fourth direction D4. Thus, the fourth side surface 110S4 may be parallel to the second side surface 110S2.

As shown in FIG. 5B, the inclined surface 110S1 and the third side surface 110S3, which are placed to face each other in the fourth direction D4, may not be parallel to each other, when viewed in a sectional view. For example, the inclined surface 110S1 may be parallel to the first direction D1, and the third side surface 110S3 may be parallel to the second direction D2, when viewed in a sectional view parallel to the second and third directions D2 and D3.

The first side surface 110S1 may be inclined relative to the rear surface 110R. The first side surface 110S1 may be inclined at an angle $\theta_B$ relative to the rear surface 110R. The angle $\theta_B$ between the inclined and rear surfaces 110S1 and 110R may be defined as an interior angle.

The angle $\theta_B$ between the inclined and rear surfaces 110S1 and 110R may be an obtuse angle. In other words, the angle $\theta_B$ between the first and rear surfaces 110S1 and 110R may be larger than a right angle. The angle $\theta_B$ between the inclined and rear surfaces 110S1 and 110R may be determined by a shape of the bending portion of the electronic circuit 200 of FIG. 4A (in particular, of the circuit film 220 of FIG. 4A). According to an exemplary embodiment of the inventive concept, owing to the inclined surface of the inclined surface 110S1, the angle $\theta_B$ between the inclined and rear surfaces 110S1 and 110R may be the obtuse angle, and thus, it may be possible to relieve a bending stress exerted on the circuit film 220. Accordingly, it may be possible to increase coupling reliability of the electronic circuit 200.

In exemplary embodiments of the inventive concept, as shown in FIG. 5C, a first base substrate 110-1 may be provided to have a first side surface 110S1-1 including a plurality of inclined surfaces. Except for features associated with the first side surface 110S1-1, the first base substrate 110-1 may be configured to have substantially the same features as those of the first base substrate 110 shown in FIG. 5A.

The first side surface 110S1-1 may include a first inclined surface I1 and a second inclined surface I2. The first inclined surface I1 may be a portion of the first side surface 110S1-1 connected to the front surface 110P. The first inclined surface I1 may be inclined at a first angle $\theta_1$ relative to the front surface 110P, when viewed in a sectional view. Here, an angle between the first inclined surface I1 and the front surface 110P may be defined as an interior angle.

The first angle $\theta_1$ may be an acute angle. In other words, the first inclined surface I1 may be inclined at an angle, which is smaller than a right angle, relative to the front surface 110P. Accordingly, the first inclined surface I1 may be overlapped with the front surface 110P, when viewed in a plan view.

The second inclined surface I2 may be another portion of the first side surface 110S1-1 connected to the rear surface 110R. The second inclined surface I2 may be inclined at a second angle $\theta_2$ relative to the rear surface 110R, when viewed in a sectional view. Here, an angle between the second inclined surface I2 and the rear surface 110R may also be defined as an interior angle.

The second angle $\theta_2$ may be an obtuse angle. In other words, the second inclined surface I2 may be inclined at an angle, which is greater than a right angle, relative to the rear surface 110R.

As described above, the electronic circuit 200 (e.g., see FIG. 1A) may include a portion that is extended along the first side surface 110S1-1 or 110S1 and is provided on the rear surface 110R. According to an exemplary embodiment of the inventive concept, the first base substrate 110 or 110-1 may be provided to have an inclined surface, allowing the rear surface 110R and the side surface to meet at an obtuse angle. Furthermore, since the first base substrate 110-1 is provided to have a plurality of inclined surfaces I1 and I2, the second angle $\theta_2$ may be further increased. The second angle $\theta_2$ may be a factor substantially determining a shape (e.g., curvature) of a bending region of the electronic circuit 200. In other words, in the case of the first base substrate 110-1 including a plurality of inclined surfaces, it may be possible to increase the second angle $\theta_2$ and to relieve a bending stress to be exerted on the electronic circuit 200.

Figure 6A:
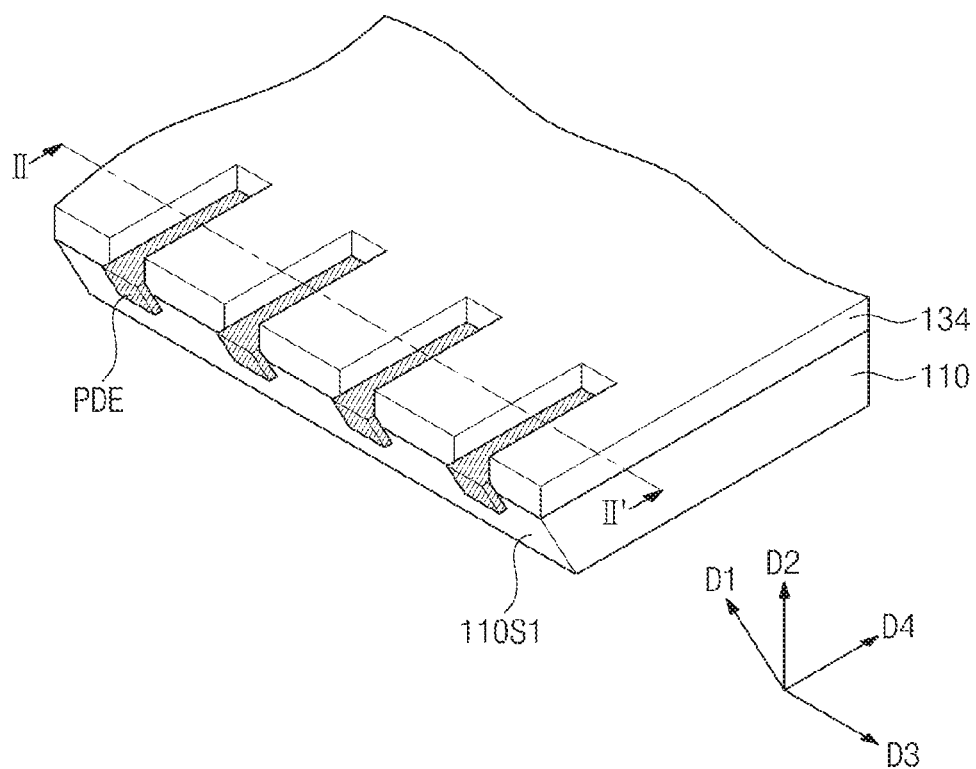
FIG. 6A is a perspective view illustrating a portion of a display panel according to an exemplary embodiment of the inventive concept.
Figure 6B:
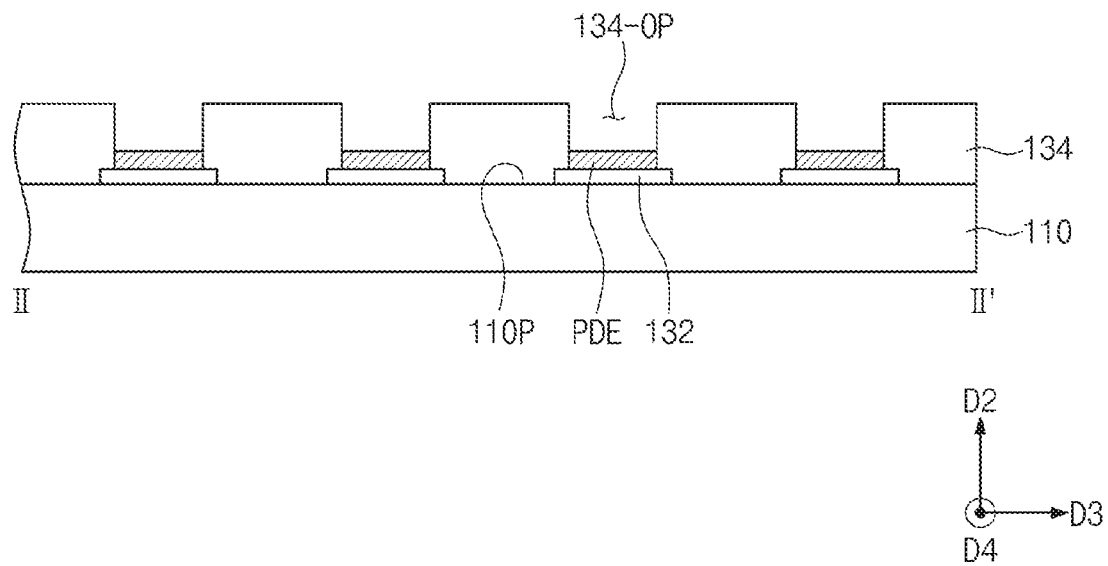
FIG. 6B is a sectional view taken along line II-II' of FIG. 6A according to an exemplary embodiment of the inventive concept.

FIG. 6A is a perspective view illustrating a portion of a display panel according to an exemplary embodiment of the inventive concept, and FIG. 6B is a sectional view taken along line II-II' of FIG. 6A according to an exemplary embodiment of the inventive concept. For convenience in illustration, only the first base substrate 110, the pixel layer 130, and the pad electrode PDE of the display panel 100 shown in FIG. 3 are illustrated FIG. 6A, and only the signal line 132 and the insulating layer 134 of the pixel layer 130 are illustrated in FIG. 6B. Hereinafter, an exemplary embodiment of the inventive concept will be described with reference to FIGS. 6A and 6B. For concise description, an element previously described with reference to FIGS. 1A to 5C may be identified by the same reference number without repeating an overlapping description thereof.

As shown in FIGS. 6A and 6B, openings 134-OP may be included in the insulating layer 134. The openings 134-OP of the insulating layer 134 may be provided to expose at least a portion of the signal line 132.

The pad electrode PDE may be provided on the inclined surface 110S1 of the first base substrate 110. At least a portion of the pad electrode PDE may be provided to fill the openings 134-OP. The pad electrode PDE may be extended from the inclined surface 110S1 to the front surface of the first base substrate 110, to be coupled to the signal line 132 exposed by the openings 134-OP. Accordingly, the pad electrode PDE may be stably formed on the inclined surface 110S1, and display panel 100 may be stably coupled to an external device (e.g., the electronic circuit 200 of FIG. 1A) through the pad electrode PDE.

Figure 7:
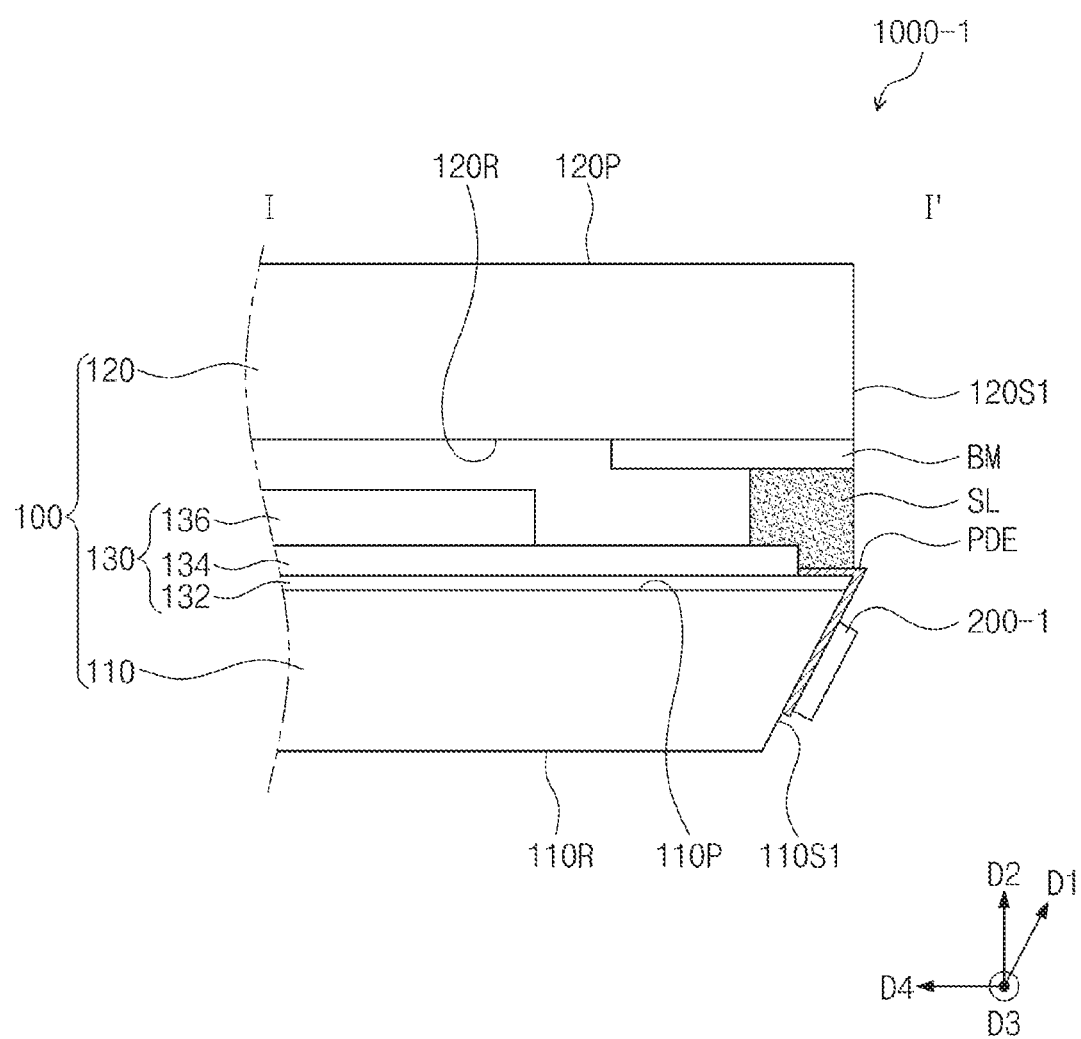
FIG. 7 is a sectional view illustrating a display device according to an exemplary embodiment of the inventive concept.

FIG. 7 is a sectional view illustrating a display device according to an exemplary embodiment of the inventive concept. For convenience in illustration, a region corresponding to FIG. 4A is illustrated in FIG. 7. Hereinafter, a display device 1000-1 according to an exemplary embodiment of the inventive concept will be described with reference to FIG. 7. For concise description, an element previously described with reference to FIGS. 1A to 6B may be identified by the same reference number without repeating an overlapping description thereof.

As shown in FIG. 7, the display device 1000-1 may include an electronic circuit 200-1 mounted on the display panel 100. The electronic circuit 200-1 may have a structure similar to the electronic circuit 200 of FIG. 4A, from which the circuit film 220 is omitted. For example, the electronic circuit 200-1 may be configured to have only the driver chip.

The electronic circuit 200-1 may be directly mounted on the inclined surface 110S1. The electronic circuit 200-1 may be in direct contact with the pad electrode PDE. Accordingly, the display device 1000-1 may be electrically coupled to the display panel 100 without an additional circuit film.

According to an exemplary embodiment of the inventive concept, the electronic circuit 200-1 may be provided on the inclined surface 110S1, not on the rear surface 110R. Since the circuit film 220 is omitted, the display device 1000-1 may be free from influence from a bending stress exerted on the circuit film 220. Accordingly, the display device 1000-1 according to an exemplary embodiment of the inventive concept may be assembled with ease and reliability.

Figure 8A:
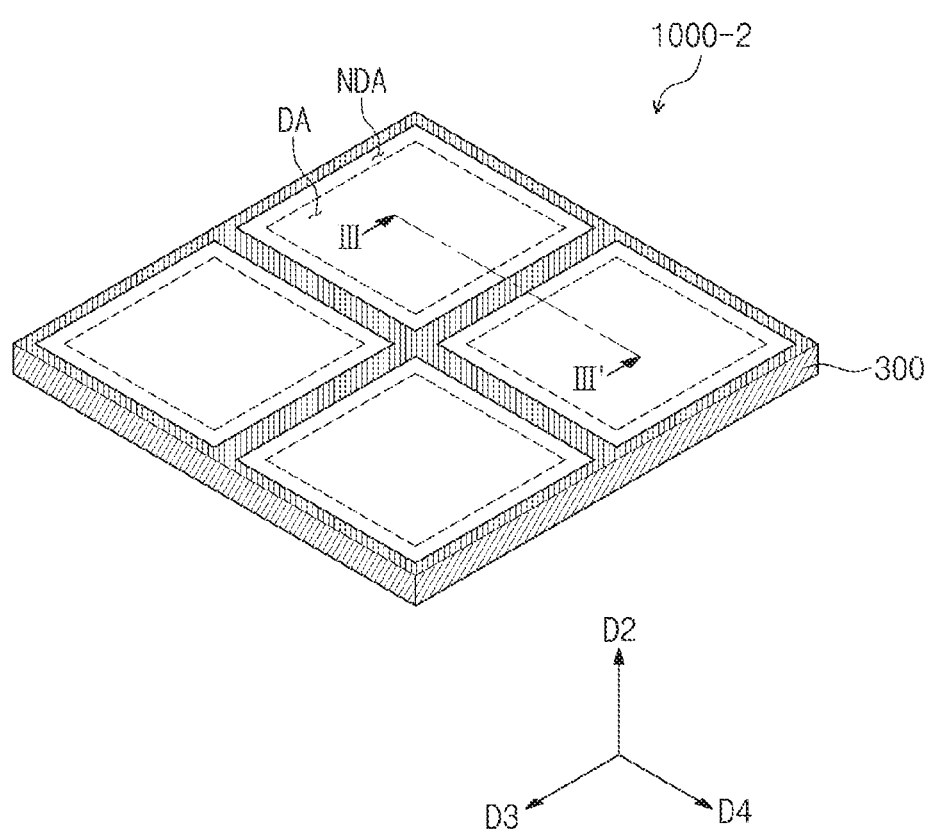
FIG. 8A is a perspective view illustrating a display device according to an exemplary embodiment of the inventive concept.
Figure 8B:
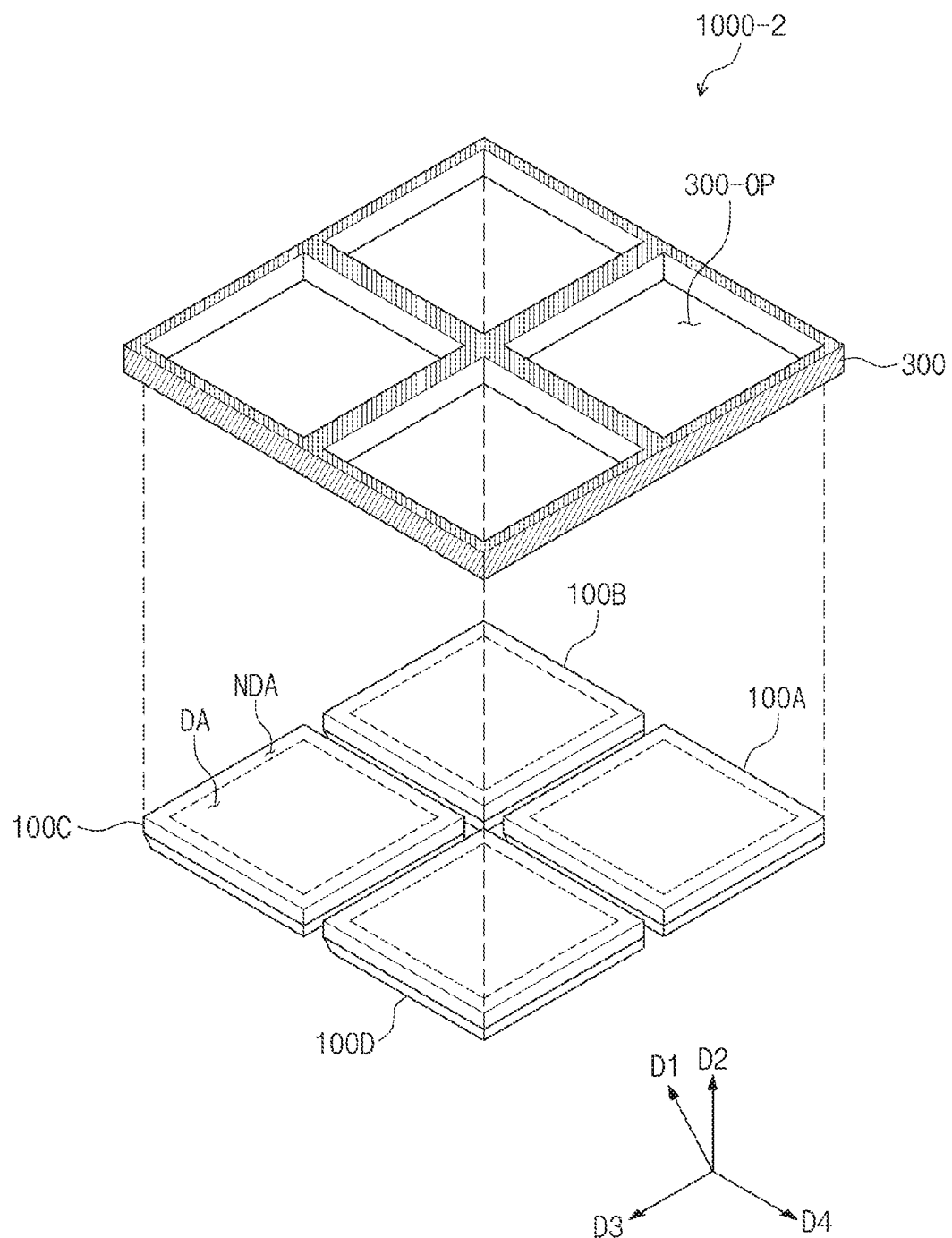
FIG. 8B is an exploded perspective view of the display device of FIG. 8A according to an exemplary embodiment of the inventive concept.
Figure 9:
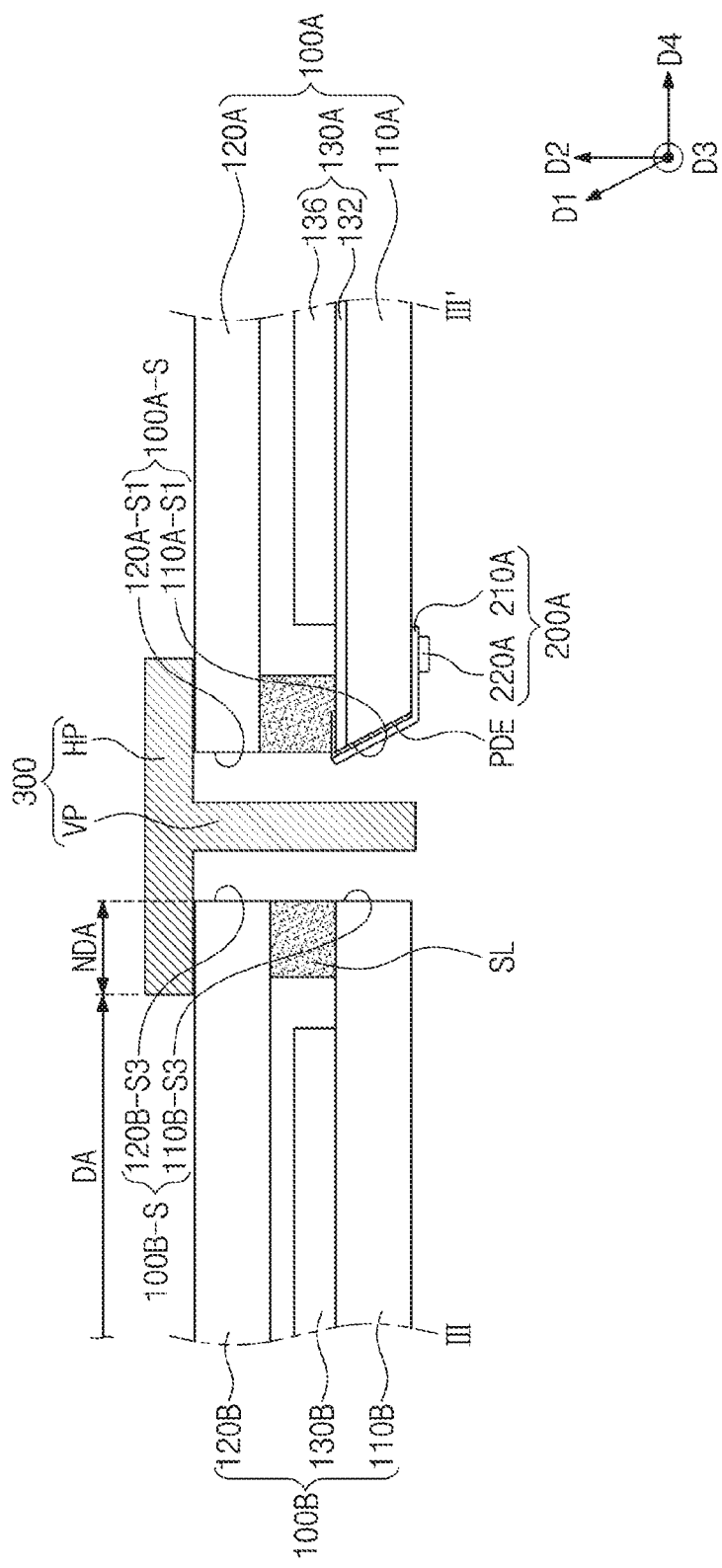
FIG. 9 is a sectional view taken along line III-III' of FIG. 8A according to an exemplary embodiment of the inventive concept.

FIG. 8A is a perspective view illustrating a display device according to an exemplary embodiment of the inventive concept, and FIG. 8B is an exploded perspective view of the display device of FIG. 8A according to an exemplary embodiment of the inventive concept. FIG. 9 is a sectional view taken along line III-III' of FIG. 8A according to an exemplary embodiment of the inventive concept. Hereinafter, an exemplary embodiment of the inventive concept will be described with reference to FIGS. 8A to 9. For concise description, an element previously described with reference to FIGS. 1A to 7 may be identified by the same reference number without repeating an overlapping description thereof.

As shown in FIGS. 8A and 8B, a display device 1000-2 may include a plurality of display panels 100A, 100B, 100C, and 100D and a cover member 300. For convenience in illustration, the electronic circuit 200 (e.g., see FIG. 9) is omitted from FIGS. 8A and 8B.

Each of the display panels 100A, 100B, 100C, and 100D may correspond to the display panel 100 shown in FIG. 1A. The display panels 100A, 100B, 100C, and 100D may be arranged in the third direction D3 and the fourth direction D4, having a matrix-shaped arrangement. However, the inventive concept is not limited thereto, and in exemplary embodiments of the inventive concept, the display panels 100A, 100B, 100C, and 100D may be arranged in a line in a specific direction.

The cover member 300 may be provided on the display panels 100A, 100B, 100C, and 100D to cover each of the display panels 100A, 100B, 100C, and 100D. The cover member 300 may be provided in the form of a single body. In the present exemplary embodiment, the display panels 100A, 100B, 100C, and 100D may be assembled with the single cover member 300 and may be used to realize the display device 1000-2 providing a plurality of display regions DA.

A plurality of openings 300-OP may be included in the cover member 300. Each of the openings 300-OP may be provided to expose the display region DA of a corresponding one of the display panels 100A, 100B, 100C, and 100D. The peripheral regions NDA may be covered with the cover member 300. The cover member 300 may be a grid-shaped structure with the openings 300-OP, when viewed in a plan view.

Referring to FIG. 9, the cover member 300 may include a vertical portion VP and a horizontal portion HP. The vertical portion VP may extend in the second direction D2, when viewed in a sectional view. The vertical portion VP may be provided between adjacent two display panels 100A and 100B to separate the two display panels 100A and 100B from each other. The vertical portion VP may be provided near side surfaces 100A-S and 100B-S of the display panels 100A and 100B, respectively.

The horizontal portion HP may be connected to the vertical portion VP. The horizontal portion HP may be substantially perpendicular to the vertical portion VP, when viewed in a sectional view. The horizontal portion HP may be provided on the display panels 100A and 100B. The peripheral regions NDA of the display panels 100A and 100B may be substantially covered with the horizontal portion HP.

As shown in FIG. 9, each of the two display panels 100A and 100B (hereinafter, a first display panel and a second display panel) may have a structure corresponding to the display panel 100 shown in FIG. 1A, as described above. For example, the first display panel 100A may include a first base substrate 110A, a second base substrate 120A, and a pixel layer 130A and may be electrically connected to an electronic circuit 200A (including a driver chip 210A and a circuit film 220A). Similarly, the second display panel 100B may include a first base substrate 110B, a second base substrate 120B, and a pixel layer 130B and may be electrically connected to an electronic circuit.

The side surface 100A-S of the first display panel 100A adjacent to the second display panel 100B may be defined by a first side surface 110A-S1 of the first base substrate 110A and a first side surface 120A-S1 of the second base substrate 120A. The first side surface 110A-S1 of the first base substrate 110A may include an inclined surface that is inclined relative to the first side surface 120A-S1 of the second base substrate 120A.

In the present exemplary embodiment, the first display panel 100A and the second display panel 100B may be provided in such a way that surfaces provided with the electronic circuit 200A faces surfaces without the electronic circuit. The side surface 100B-S of the second display panel 100B adjacent to the first display panel 100A may be defined by a third side surface 110B-S3 of the first base substrate 110B and a third side surface 120B-S3 of the second base substrate 120B. The third side surface 110B-S3 of the first base substrate 110B and the third side surface 120B-S3 of the second base substrate 120B may be surfaces that are substantially parallel to each other, and the side surface 100B-S of the second display panel 100B adjacent to the first display panel 100A may be an aligned surface in a thickness direction.

According to an exemplary embodiment of the inventive concept, at least a portion of the electronic circuit 200A, which is connected to the first display panel 100A and is provided on the side surface 100A-S of the first display panel 100A, may be spaced apart from the vertical portion VP of the cover member 300. Even if the cover member 300 and the first display panel 100A are in close contact with each other and the first side surface 120A-S1 of the second base substrate 120A is in contact with the vertical portion VP, at least a portion of the electronic circuit 200A, which is provided on the inclined surface 110A-S1, may be not in contact with the vertical portion VP. Accordingly, it may be possible to prevent collision between the cover member 300 and the electronic circuit 200A, and thus, reliability of the display device 1000-2 may be increased.

Figure 10:
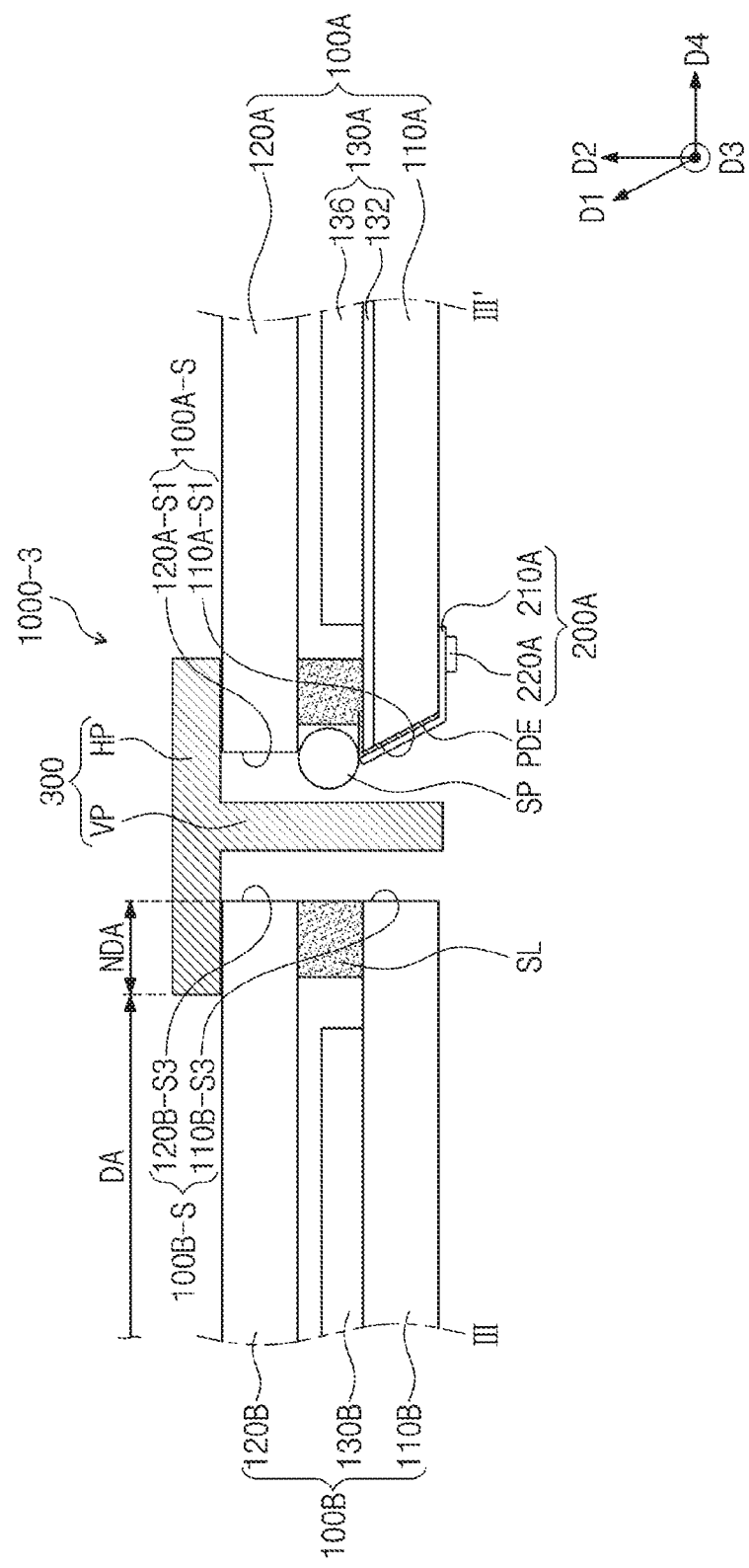
FIG. 10 is a sectional view illustrating a portion of a display device according to an exemplary embodiment of the inventive concept.

FIG. 10 is a sectional view illustrating a portion of a display device according to an exemplary embodiment of the inventive concept. For convenience in illustration, FIG. 10 illustrates a region corresponding to that of FIG. 9. Hereinafter, a display device 1000-3 according to an exemplary embodiment of the inventive concept will be described with reference to FIG. 10. For concise description, an element previously described with reference to FIGS. 1A to 9 may be identified by the same reference number without repeating an overlapping description thereof.

As shown in FIG. 10, the display device 1000-3 may further include a spacer member SP. The spacer member SP may be provided between the first and second base substrates 110A and 120A of the first display panel 100A.

In the present exemplary embodiment, the spacer member SP may have an elastic property. The spacer member SP may be formed of or include an impact absorbing material. For example, the spacer member SP may be formed of or include at least one of silicone, rubber, or porous materials.

The minimum distance between the spacer member SP and the vertical portion VP may be smaller than the minimum distance between the side surface 100A-S of the first display panel 100A and the vertical portion VP. Accordingly, even if the vertical portion VP and the display panel 100A are assembled to be in close contact with each other, the spacer member SP, not the side surface 100A-S of the first display panel 100A or the electronic circuit 200A, may be previously in contact with the vertical portion VP, and this may make it possible to prevent the display panel from being vibrated and to reduce impact to be exerted on the display panel. Accordingly, it may be possible to increase reliability of the display device 1000-3.

Figure 11A:
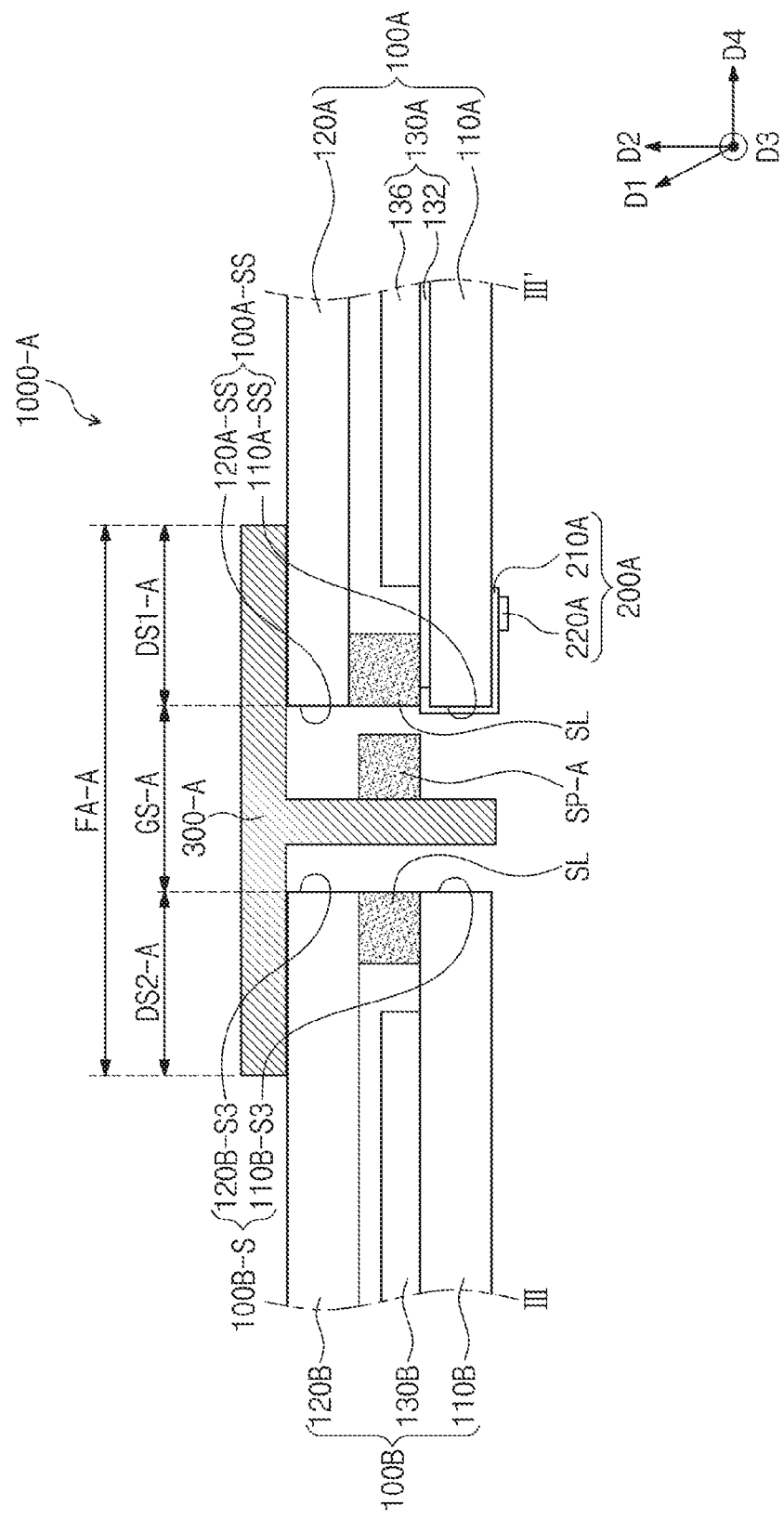
FIG. 11A is a sectional view illustrating a portion of a display device according to comparative embodiments.
Figure 11B:
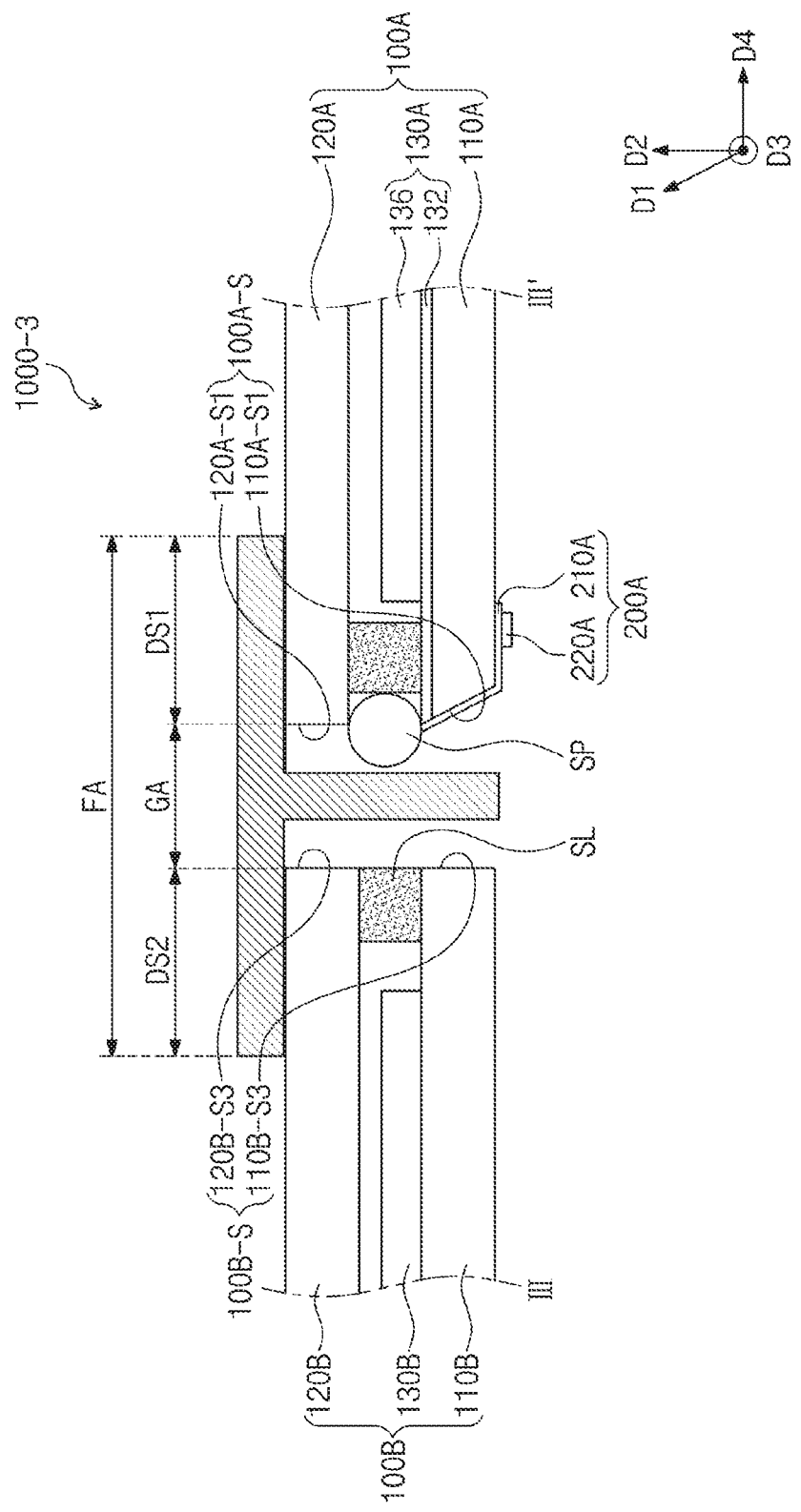
FIG. 11B is a sectional view illustrating a portion of a display device according to an exemplary embodiment of the inventive concept.

FIG. 11A is a sectional view illustrating a portion of a display device according to comparative embodiments. FIG. 11B is a sectional view illustrating a portion of a display device according to an exemplary embodiment of the inventive concept. For convenience in illustration, a display device 1000-A according to comparative embodiments and the display device 1000-3 according to an exemplary embodiment of the inventive concept illustrate corresponding regions, and the display device 1000-3 shown in FIG. 10 is illustrated in FIG. 11B.

In the display device 1000-A according to the comparative embodiments, a side surface 100A-SS of the first display panel 100A adjacent to the second display panel 100B may not include an inclined surface. Accordingly, side surfaces 110A-SS and 120A-SS of the first and second base substrates 110A and 120A constituting the side surface 100A-SS of the first display panel 100A may be aligned with each other in a thickness direction. The side surface 100A-SS of the first display panel 100A may have substantially the same shape as a side surface 100B-S (including side surfaces 110B-S3 and 120B-S3) of the second display panel 100B opposite thereto.

A horizontal region FA-A of a cover member 300-A may include a first region DS1-A covering the first display panel 100A, a second region DS2-A covering the second display panel 100B, and a third region GA-A covering a region between the first and second display panels 100A and 100B. Similarly, in the display device 1000-3 according to an exemplary embodiment of the inventive concept, a horizontal region FA of the cover member 300 may include a first region DS1 covering the first display panel 100A, a second region DS2 covering the second display panel 100B, and a third region GA covering a region between the first and second display panels 100A and 100B.

Since the first and second regions DS1-A and DS2-A of the display device 1000-A according to the comparative embodiments cover peripheral regions of the first and second display panels 100A and 100B, they may be substantially the same as the first and second regions DS1 and DS2 of the display device 1000-3.

However, the third region GA-A of the display device 1000-A according to the comparative embodiments may have a width larger than that of the third region GA of the display device 1000-3. In the display device 1000-A according to the comparative embodiments, a spacer member SP-A for preventing the electronic circuit 200A and the cover member 300-A from colliding with each other may be provided near the cover member 300-A. In other words, a region for the spacer member SP-A should be further provided in the third region GA-A in the display device 1000-A according to the comparative embodiments, and thus, the third region GA-A may have a width larger than that of the third region GA of the display device 1000-3.

In the display device 1000-3, the spacer member SP may be provided between the first base substrate 110A and the second base substrate 120A, and thus, the spacer member SP-A provided in the cover member 300 may be omitted from the display device 1000-3.

In the display device 1000-3 including a plurality of display panels, the horizontal region FA of the cover member 300 may function substantially as a bezel. According to an exemplary embodiment of the inventive concept, since a width and an area of the horizontal region FA can be reduced, it may be possible to reduce a distance between the display panels and to realize a small bezel region. Thus, a multi display device may be assembled with ease and reliability.

FIGS. 12A to 12I are perspective views illustrating a method of fabricating a display device according to an exemplary embodiment of the inventive concept. For convenience in illustration, only a portion of the display device is illustrated in FIGS. 12A to 12I. Hereinafter, a method of fabricating a display device, according to an exemplary embodiment of the inventive concept, will be described with reference to FIGS. 12A to 12I. For concise description, an element previously described with reference to FIGS. 1A to 11B may be identified by the same reference number without repeating an overlapping description thereof.

Figure 12A:
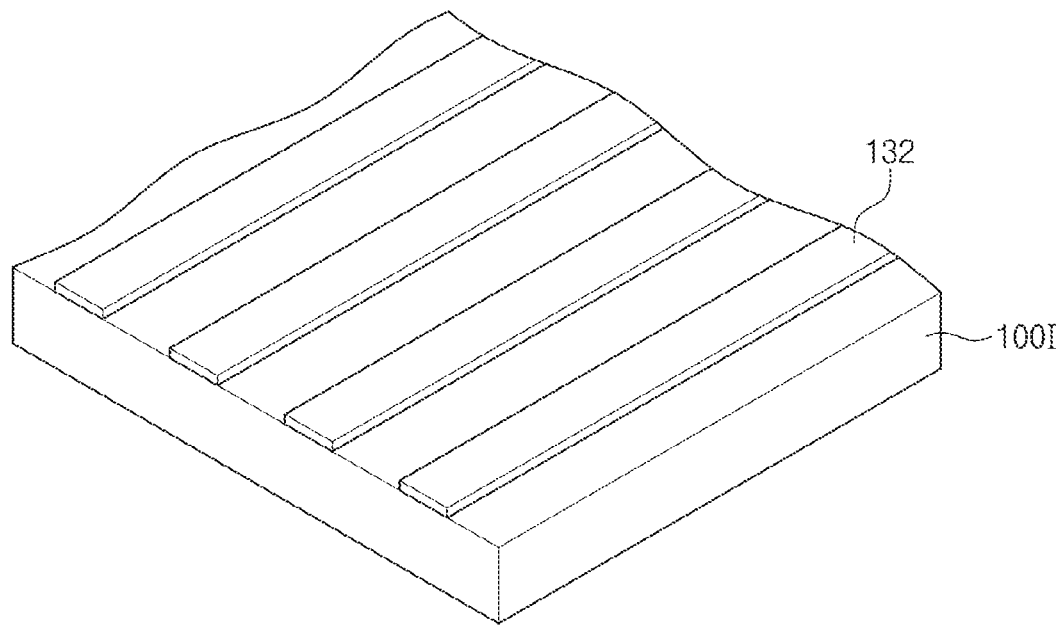
FIGS. 12A to 12I are perspective views illustrating a method of fabricating a display device according to an exemplary embodiment of the inventive concept.

As shown in FIG. 12A, the signal lines 132 may be formed on an initial first base substrate 100I. The signal lines 132 may be formed by patterning a conductive material. In an exemplary embodiment of the inventive concept, various processes, such as a deposition process or a photolithography process, may be further performed to form the signal lines 132.

In an exemplary embodiment of the inventive concept, various conductive materials may be used as the conductive material for the signal lines 132. For example, the conductive material may include at least one of metals, conductive oxides, conductive polymers, and so forth. In the case where the signal lines 132 are formed of a conductive oxide material, the signal lines 132 may be optically transparent, and thus, it may be possible to prevent the signal lines 132 from being recognized by a user.

The signal lines 132 may be formed to be spaced apart from one another. In the present exemplary embodiment, the signal lines 132 are illustrated to be arranged in a specific direction and to have a line shape, but the inventive concept is not limited thereto.

Figure 12B:
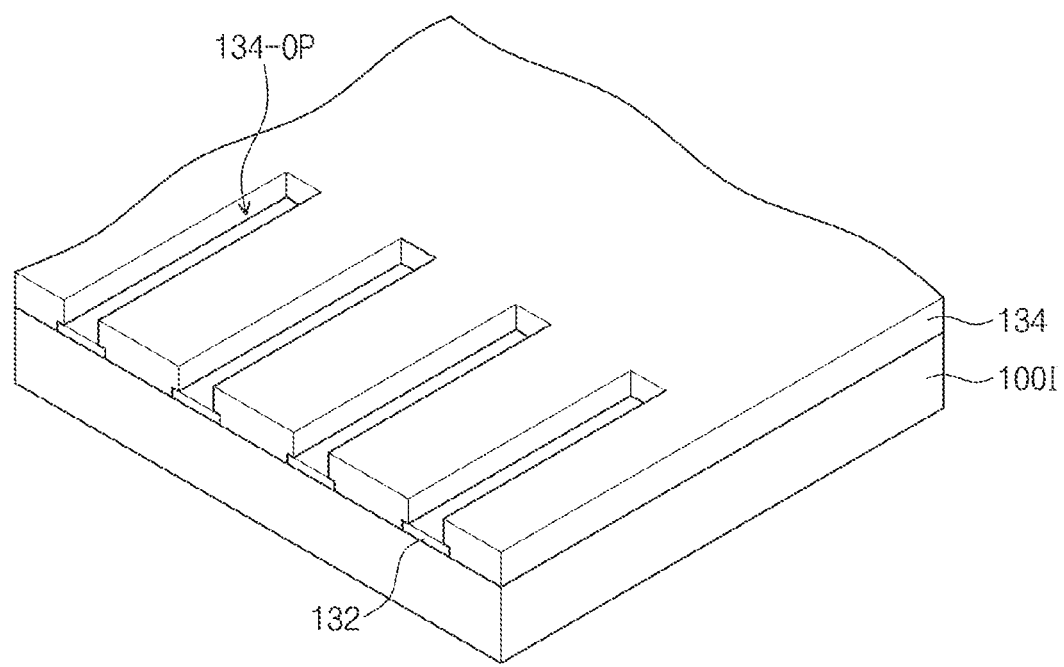

Thereafter, as shown in FIG. 12B, the insulating layer 134 may be formed on the initial first base substrate 100I to cover the signal lines 132. A portion of the insulating layer 134 may be removed to form a plurality of the openings 134-OP, each of which exposes a portion of a corresponding one of the signal lines 132.

The insulating layer 134 may be formed of or include an insulating material. The insulating layer 134 may include at least one of organic and inorganic materials. In the case where the insulating layer 134 is formed of the inorganic material, the insulating layer 134 may be formed in the form of a thin film or may have a relatively small thickness. In the case where the insulating layer 134 is formed of the organic material, the insulating layer 134 may be formed to have a flat surface, and since a thickness of the insulating layer 134 can be easily controlled, it may be possible to stably realize an electric separation between the signal lines 132. The insulating layer 134 may be formed to have a single-structure or a multi-layered structure including a plurality of layers, but the inventive concept is not limited thereto.

Figure 12C:
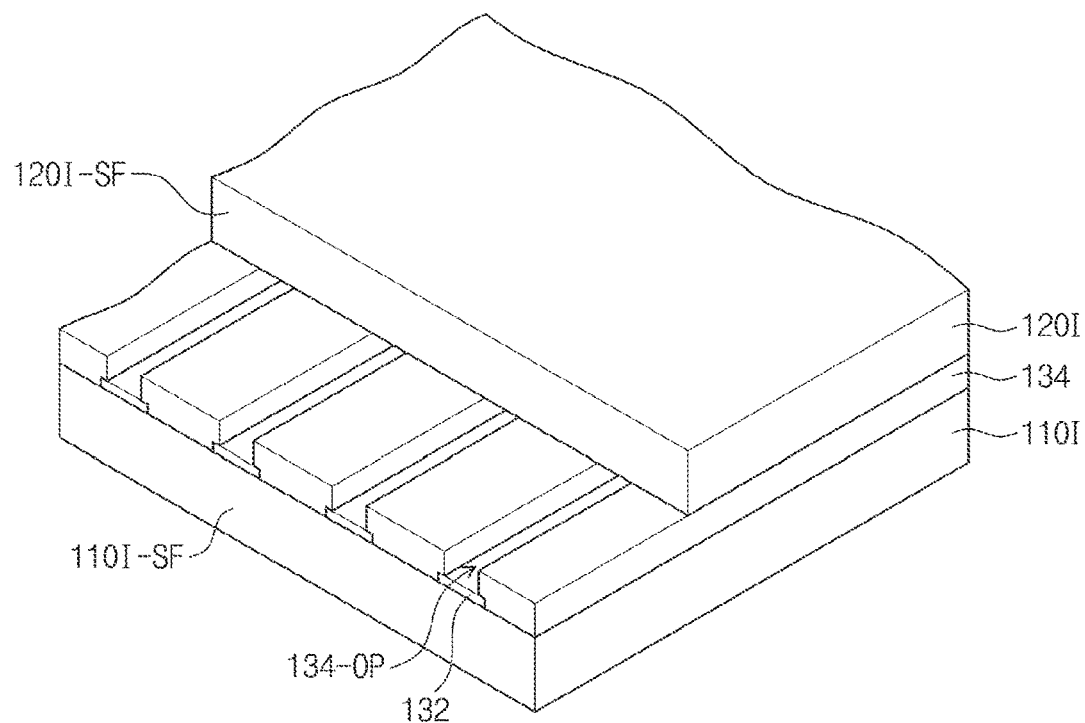

As shown in FIG. 12C, an initial second base substrate 120I having a side surface 120I-SF may be bonded to the initial first base substrate 110I. A pixel may be formed between the initial second base substrate 120I and the initial first base substrate 110I. The pixels may be formed after or before the bonding between the initial second base substrate 120I and the initial first base substrate 110I, but the inventive concept is not limited thereto. For convenience in illustration, in the present exemplary embodiment, the pixels are not illustrated.

The initial second base substrate 120I may be bonded to the initial first base substrate 110I to expose at least a portion of the initial first base substrate 110I. The initial second base substrate 120I may be provided to have an area that is smaller than that of the initial first base substrate 110I.

Figure 12D:
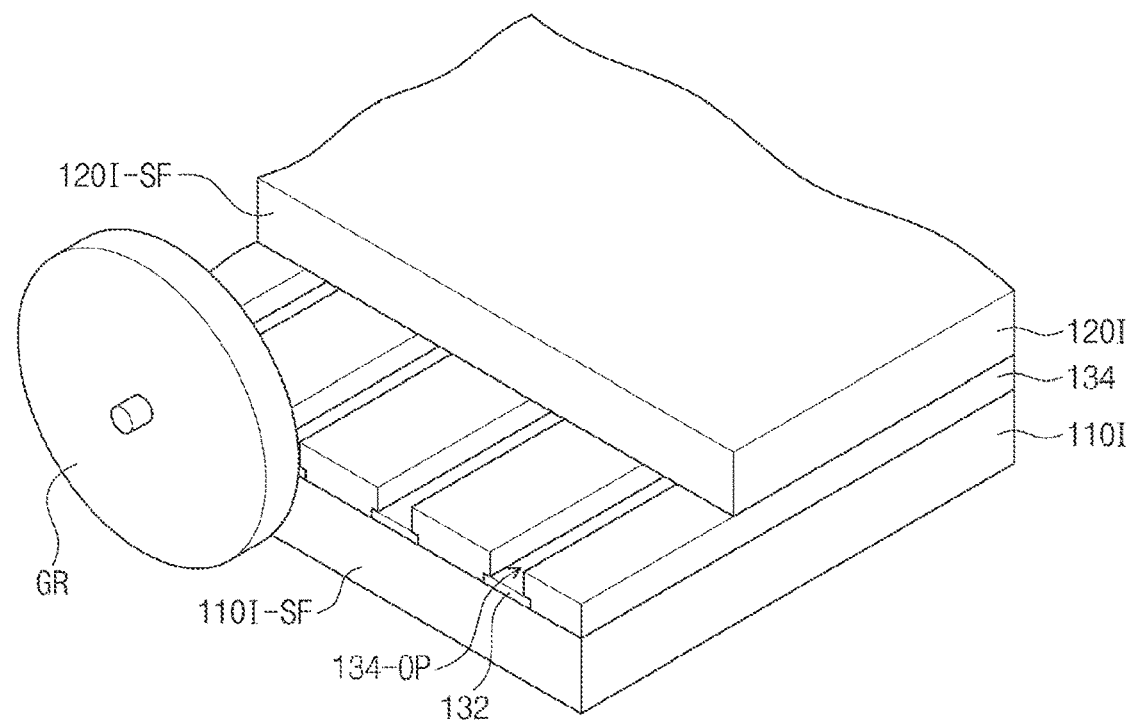
Figure 12E:
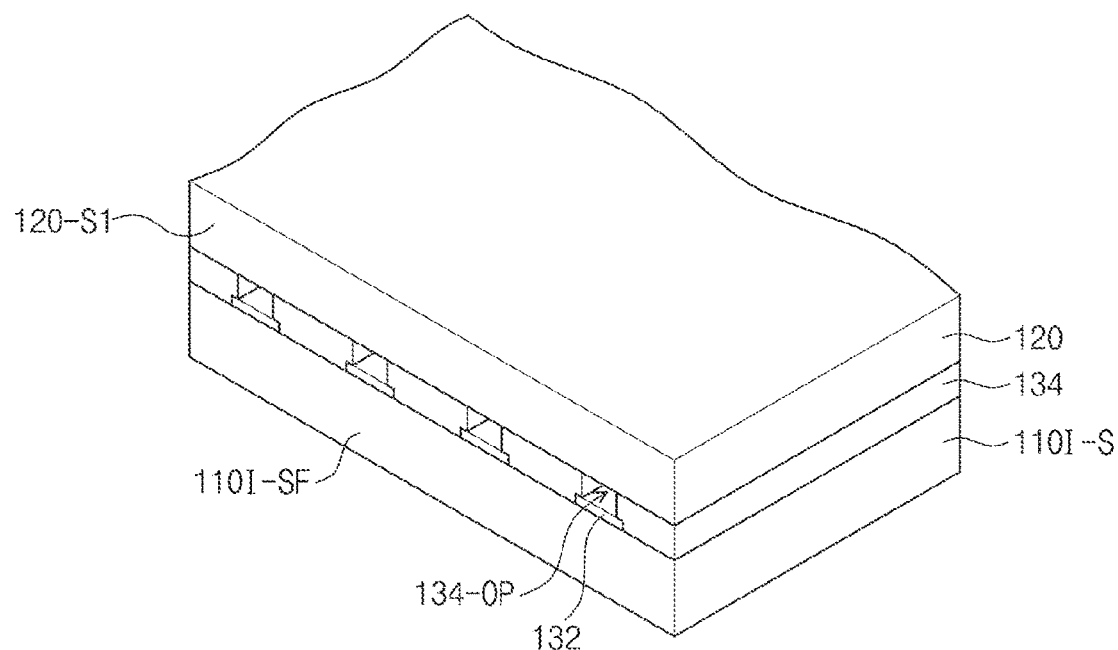

As shown in FIGS. 12D and 12E, a first grinding process may be performed on a side surface of the initial first base substrate 110I. For example, a grinder GR may be used to grind a side surface 110I-SF of the initial first base substrate 110I, and this may allow the initial first base substrate 110I and the initial second base substrate 120I to have side surfaces aligned to each other. In an exemplary embodiment of the inventive concept, a portion of the side surface 120I-SF of the initial second base substrate 120I may be grinded during the first grinding process.

As a result, an initial first base substrate 110I-S and the second base substrate 120 may be formed to have the side surface 110I-SF (also referred to as a first side surface) and a second side surface 120-S1, respectively, which are aligned with each other. Since the openings 134-OP formed in the insulating layer 134 are covered with the second base substrate 120, each of the openings 134-OP may have a tunnel shape.

Figure 12F:
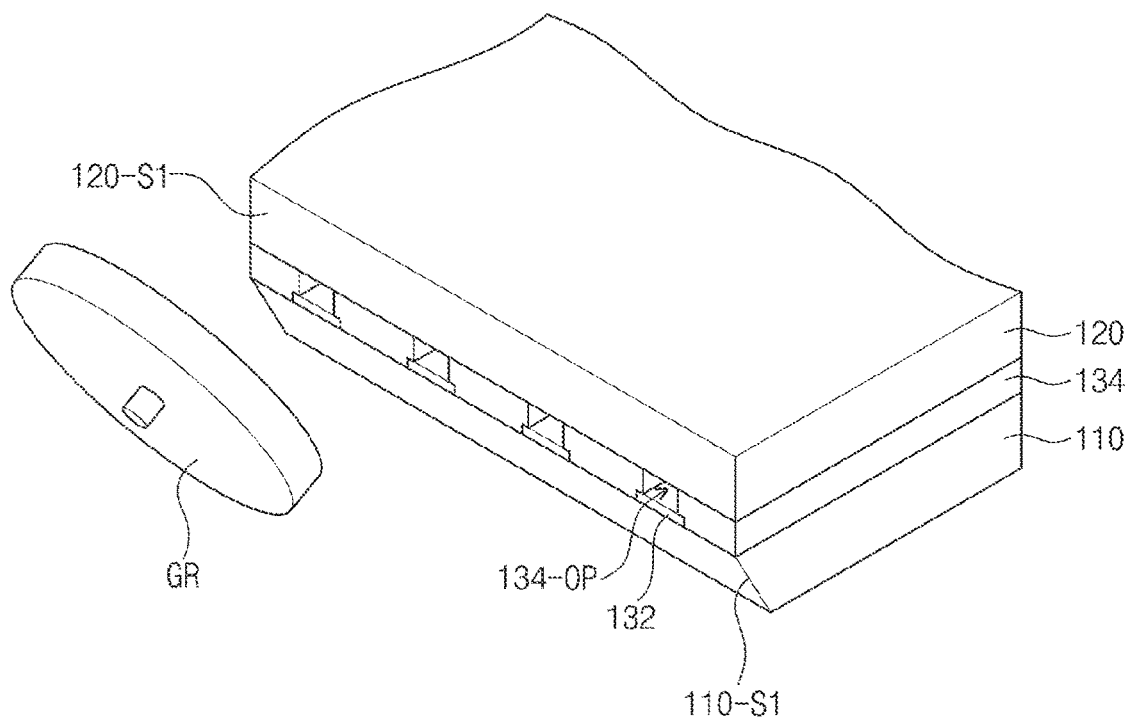

As shown in FIG. 12F, a second grinding process may be performed on a side surface of the initial first base substrate 110I-S. For example, the second grinding process may be performed to form the inclined surface 110-S1 on the first side surface 110I-SF of the initial first base substrate 110I-S, and the grinder GR may be used to slantingly grind the first side surface 110I-SF of the initial first base substrate 110I-S. For example, during the second grinding process, the grinder GR may be inclined at an angle relative to that of the grinder GR shown in FIG. 12D. Accordingly, the first base substrate 110 with the inclined surface 110-S1 may be formed.

Figure 12G:
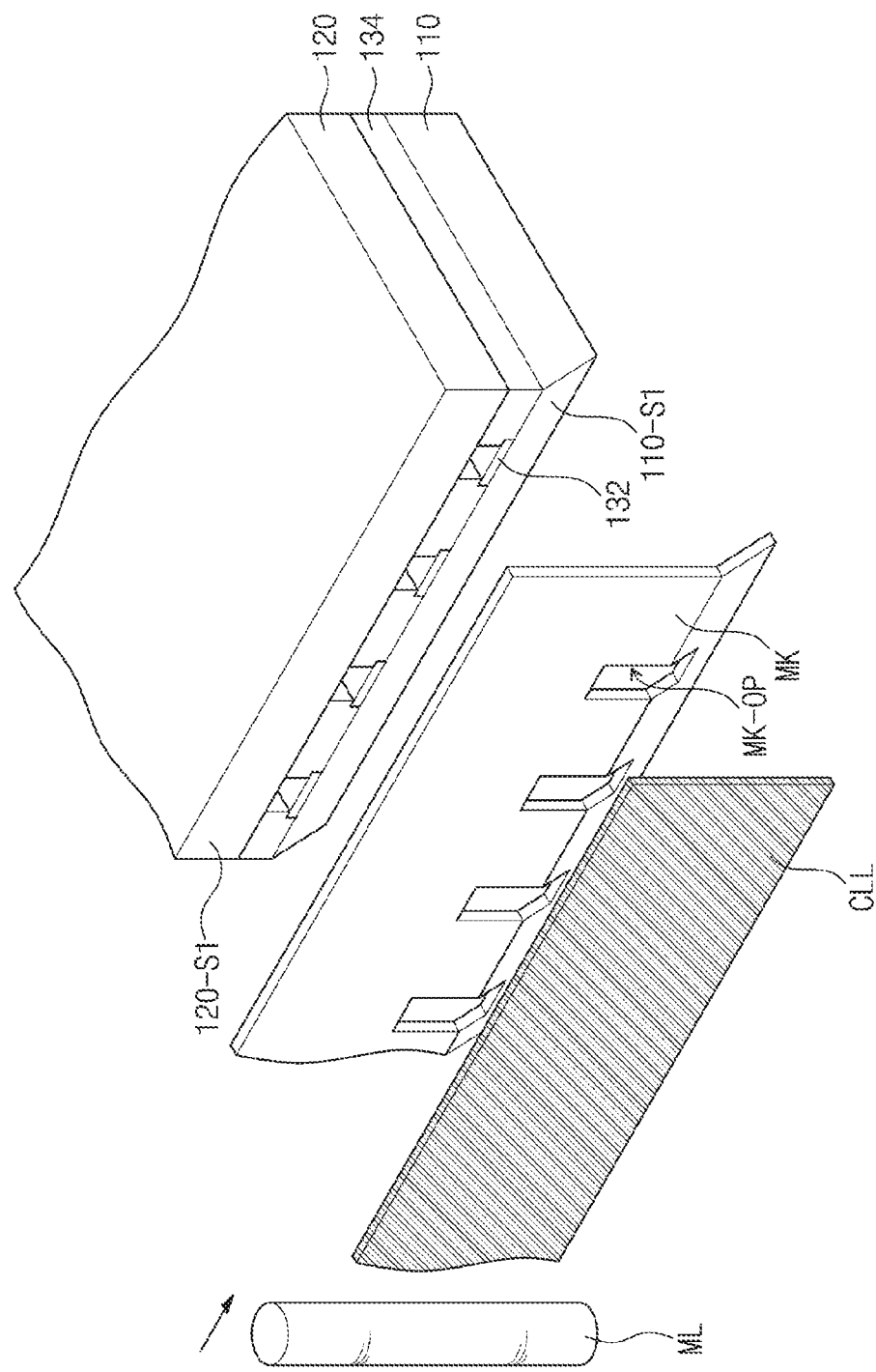
Figure 12H:
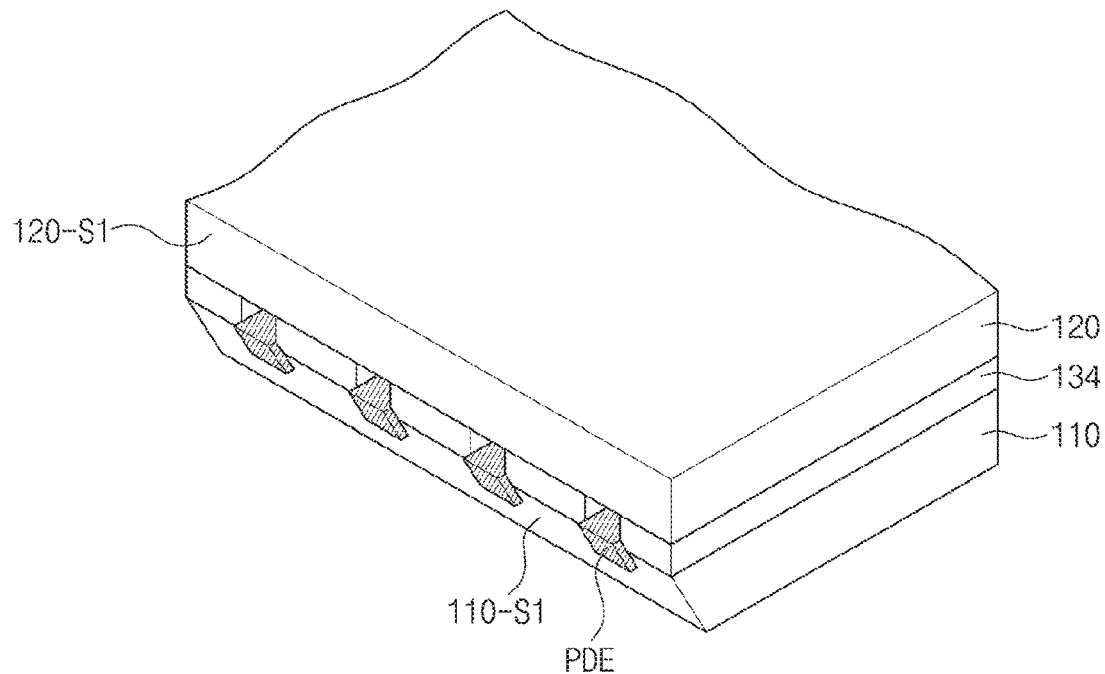

As shown in FIGS. 12G and 12H, a conductive paste CLL may be used to form the pad electrode PDE on the inclined surface 110-S1. As illustrated in FIG. 12G, the pad electrode PDE may be formed by a silk-screen printing process, but the inventive concept is not limited thereto.

As shown in FIG. 12G, a mask MK may be disposed to face the inclined surface 110-S1 and the second side surface 120-S1. The mask MK may have a non-flat or bent shape capable of covering both of the inclined surface 110-S1 and the second side surface 120-S1. Accordingly, the pad electrode PDE having a non-flat shape may be formed by a single silk-screen printing process. However, the inventive concept is not limited thereto, and in exemplary embodiments of the inventive concept, the mask MK may be provided in the form of a single object having a flat shape, and the pad electrode PDE may be formed through a plurality of printing processes.

The mask MK may be provided to have openings MK-OP, which are arranged in a specific direction. The openings MK-OP may be formed along a non-flat or bending portion of the mask MK. The mask MK may be disposed or aligned along the side surface of the first base substrate 110 in such a way that the openings MK-OP are arranged at positions corresponding to the openings 134-OP of the insulating layer 134. The openings MK-OP may be formed to be overlapped with a portion of the inclined surface 110-S1 and the openings 134-OP having the tunnel shape.

The conductive paste CLL may be provided to face the inclined surface 110-S1 and the second side surface 120-S1 with the mask MK interposed therebetween. The conductive paste CLL may be uniformly coated on the mask MK. The conductive paste CLL may include a highly conductive material. For example, the conductive paste CLL may be formed of or include at least one of metallic materials (e.g., copper or silver). Additionally, the conductive paste CLL may include transparent conductive materials.

For example, the conductive paste CLL may include materials substantially the same as the signal lines 132. In this case, the conductive paste CLL can be reliably coupled to the signal line 132. De-lamination between the conductive paste CLL and the signal line 132 may be reduced. Alternatively, the conductive paste CLL may include materials different from the signal lines 132. In this case, the conductive paste CLL may include a higher conductive material than the signal lines 132. Therefore the pad electrode PDE can be formed to have better conductivity than the signal lines 132. In an exemplary embodiment of the inventive concept, the conductive paste CLL can include a variety of materials if the materials have conductivity, and is not limited to specific materials.

In an exemplary embodiment of the inventive concept, a milling member ML may be provided to allow the conductive paste CLL to be in close contact with the mask MK. The milling member ML may be configured to exert pressure uniformly on the conductive paste CLL while moving in a direction of the depicted arrow. Accordingly, the conductive paste CLL may be easily coated on the inclined surface 110-S1 through the openings MK-OP of the mask MK.

The conductive paste CLL may be inserted into the tunnel-shaped regions of the insulating layer 134 through the openings MK-OP. In an exemplary embodiment of the inventive concept, the conductive paste CLL may be transported into the tunnel-shaped regions (e.g., onto top surfaces of the signal lines 132) by a capillary phenomenon.

If the printing process is finished, the pad electrode PDE may have a shape covering the inclined surface 110-S1 and at least a portion of the top surfaces of the signal lines 132, as shown in FIG. 12H. In exemplary embodiments of the inventive concept, the pad electrode PDE may be formed using a photolithography process or a plating process, rather than the silk-screen printing process, but the inventive concept is not limited to a specific method of forming the pad electrode PDE.

Figure 12I:
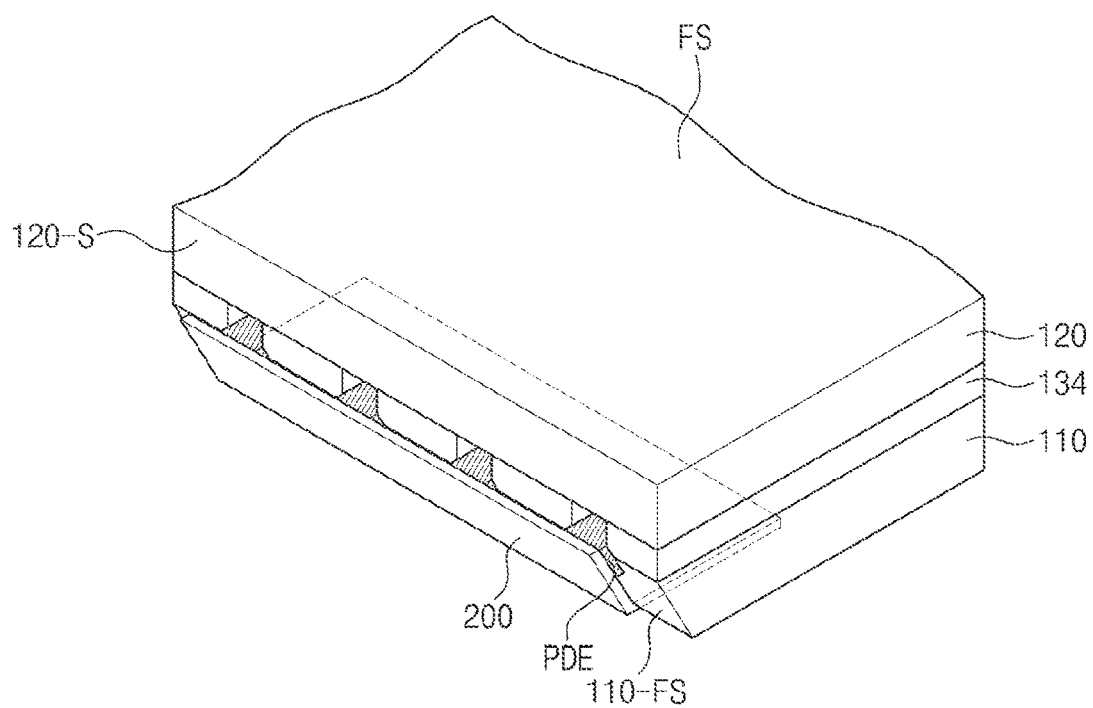

As shown in FIG. 12I, the electronic circuit 200 may be coupled to the pad electrode PDE, and as a result, the display device may be formed. The electronic circuit 200 may be formed to cover not only the inclined surface 110-S1 but also the rear surface of the first base substrate 110. The electronic circuit may not cover the inclined surface 110-S1 in its entirety, and a front surface 110-FS of the inclined surface 110-S1 may be exposed. However, the inventive concept is not limited thereto, and in exemplary embodiments of the inventive concept, the electronic circuit 200 may be directly mounted on the inclined surface 110-S1 in a chip-on-glass manner, to be coupled to the pad electrode PDE.

According to an exemplary embodiment of the inventive concept, since a coupling region between an electronic circuit and a display panel is formed on a side surface of the display panel, a bezel region of the display panel can be designed independently from the coupling region between the electronic circuit and the display panel. This makes it possible to reduce an area of the bezel region.

According to an exemplary embodiment of the inventive concept, an inclined surface is provided on the side surface of the display panel, and the electronic circuit is coupled to the inclined surface. Thus, it is possible to stably protect the coupling region between the electronic circuit and the display panel from impact from external components located outside the display panel.

While the inventive concept have been particularly shown and described with reference to exemplary embodiments thereof, it will be understood by one of ordinary skill in the art that variations in form and detail may be made thereto without departing from the spirit and scope of the inventive concept as set forth by the following claims.

What is claimed is:

1. A display device, comprising:
   a first base substrate including a first planar surface and a first side surface, which is connected to the first planar surface and extends in a first direction when viewed in a sectional view;
   a second base substrate including a second planar surface, which is disposed to face the first planar surface in a second direction crossing the first direction when viewed in a sectional view, and a second side surface, which is connected to the second planar surface and extends in the second direction;
   a pixel disposed between the first base substrate and the second base substrate;
   a signal line disposed on the first base substrate and connected to the pixel;
   a pad electrode disposed on the first side surface and connected to the signal line, wherein the pad electrode extends from the first planar surface and is bent around a first edge of the first base substrate to be disposed on the first side surface: and
   an electronic circuit connected to the pad electrode,
   wherein the first direction is inclined relative to the second direction,
   wherein the first side surface comprises a plurality of inclined surfaces,
   when viewed in the sectional view, the plurality of inclined surfaces comprise a first inclined surface and a second inclined surface having a different slope from the first inclined surface.

2. The display device of claim 1, wherein the electronic circuit comprises a chip mounted on the pad electrode.

3. The display device of claim 1, wherein the electronic circuit comprises:
   a circuit film attached to the first side surface; and
   a chip mounted on the circuit film.

4. The display device of claim 3, wherein the circuit film is extended along the first side surface to face a rear surface of the first base substrate, and
   the chip is disposed on the rear surface of the first base substrate.

5. The display device of claim 4, wherein an area of the first planar surface is substantially equal to that of the second planar surface, and
   an area of the rear surface of the first substrate is less than an area of the first planar surface.

6. The display device of claim 1, wherein the pad electrode
   a first portion disposed on the first side surface and connected to the electronic circuit; and
   a second portion disposed on the first planar surface and. connected to the signal
   wherein the first and second portions constitute a single body of the pad electrode.

7. The display device of claim 6, wherein an angle between an extension direction of the first portion and an extension direction of the second portion is an acute angle.

8. The display device of claim 6, further comprising an insulating layer disposed on the signal line to provide an opening exposing a portion of the signal line,
   wherein the first portion is disposed to the opening.

9. The display device of el aim wherein the pad electrode comprises a material different from the signal line.

10. The display device of claim 9, wherein the signal line comprises a transparent conductive oxide material.

11. The display device of claim 10, wherein the pad electrode comprises a metallic material.

12. The display device of claim 1, wherein the electronic circuit comprises a circuit film attached to the first side surface, wherein the circuit film covers the first side surface and is hem around a second edge of the first base substrate to cover a rear surface of the first base substrate.

13. A display device, comprising:
   a first display panel comprising a first base substrate including a first side surface, a second base substrate facing the first base substrate and including a second side surface, a pixel disposed between the first base substrate and the second base substrate, and a pad electrode disposed on the first side surface and connected to the pixel;
   an electronic circuit connected to the pad electrode;

a second display panel spaced apart from the first display panel in a specific direction, and comprising a third base substrate including a third side surface facing the first side surface and a fourth base substrate facing the third base substrate and including a fourth side surface facing the second side suffice; and a cover member disposed between the first display panel and the second display panel, wherein the first side surface is extended in a direction that is inclined relative to the second side surface, and the third side surface is extended in a direction parallel to the fourth side surface.

14. The display device of claim 13, further comprising a spacer disposed between the first base substrate and the second base substrate, wherein a minimum distance between the spacer and the cover member is less than that between the first side surface and the cover member, when measured in the specific direction.

15. The display device of claim 14, wherein the spacer has, an elastic property.

16. The display device of claim 13, wherein the electronic circuit comprises a chip mounted on the first side surface.

17. The display device of claim 13, wherein the electronic circuit comprises:

a circuit film disposed on the first side surface and connected to the pad electrode; and a chip mounted on the circuit film.

18. The display device of claim 13, wherein the first side surface comprises a plurality of inclined surfaces, each of which is inclined at an angle relative to the second side surface.

19. The display device of claim 13, wherein the cover member comprises:

a horizontal portion extending in the specific direction and covering a portion of the second base substrate and a portion of the fourth base substrate; and a vertical portion extending from the horizontal portion in a direction crossing the specific direction and being interposed between the first display panel and the second display panel, wherein the vertical portion is parallel to the second side surface.

20. The display device of claim 19, wherein the cover member is disposed apart from the pad electrode.

* * * * *